(12) United States Patent
Sarayama et al.

(10) Patent No.: US 7,718,002 B2
(45) Date of Patent: May 18, 2010

(54) CRYSTAL MANUFACTURING APPARATUS

(75) Inventors: Seiji Sarayama, Miyagi (JP); Hirokazu Iwata, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 44 days.

(21) Appl. No.: 12/042,964

(22) Filed: Mar. 5, 2008

(65) Prior Publication Data

US 2008/0216737 A1  Sep. 11, 2008

(30) Foreign Application Priority Data

Mar. 7, 2007 (JP) ............................ 2007-056859
Dec. 12, 2007 (JP) ............................ 2007-320289

(51) Int. Cl.
*C30B 13/14* (2006.01)

(52) U.S. Cl. .................. 117/206; 117/200; 117/204; 117/216; 117/900

(58) Field of Classification Search .............. 117/200, 117/204, 206, 216, 900
See application file for complete search history.

(56) References Cited

U.S. PATENT DOCUMENTS

| | | | |
|---|---|---|---|
| 5,868,837 | A | 2/1999 | DiSalvo et al. |
| 6,780,239 | B2 | 8/2004 | Sarayama et al. |
| 6,911,083 | B2 * | 6/2005 | Hara ........................... 117/91 |
| 6,949,140 | B2 | 9/2005 | Sarayama et al. |
| 7,220,311 | B2 | 5/2007 | Iwata et al. |
| 2004/0226503 | A1 | 11/2004 | Iwata et al. |
| 2005/0026318 | A1 * | 2/2005 | Sarayama et al. .............. 438/22 |
| 2007/0034143 | A1 | 2/2007 | Sarayama et al. |
| 2007/0084399 | A1 | 4/2007 | Sarayama et al. |
| 2007/0128746 | A1 | 6/2007 | Iwata et al. |
| 2007/0215034 | A1 * | 9/2007 | Iwata et al. ................... 117/79 |
| 2008/0264331 | A1 * | 10/2008 | Iwata et al. ................... 117/13 |
| 2008/0282969 | A1 * | 11/2008 | Sarayama et al. ............. 117/73 |

FOREIGN PATENT DOCUMENTS

| | | |
|---|---|---|
| JP | 2003-178984 | 6/2003 |
| JP | 2003-313098 | 11/2003 |
| JP | 2003-313099 | 11/2003 |
| JP | 2004-292286 | 10/2004 |
| JP | 2005-335983 | 12/2005 |
| JP | 3788037 | 4/2006 |

* cited by examiner

*Primary Examiner*—Robert M Kunemund
(74) *Attorney, Agent, or Firm*—Dickstein Shapiro LLP

(57) ABSTRACT

A crystal manufacturing apparatus for manufacturing a group III nitride crystal includes a crucible that holds a mixed molten liquid including an alkali metal and a group III metal; a reaction vessel accommodating the crucible in the reaction vessel; a heating device that heats the crucible with the reaction vessel; a holding vessel having a lid that is capable of opening and closing, accommodating the reaction vessel and the heating device in the holding vessel; a sealed vessel accommodating the holding vessel in the sealed vessel, having an operating device that enables opening the lid of the holding vessel for supplying source materials into the crucible and taking out a manufactured GaN crystal under a sealed condition, and closing the lid of the holding vessel that is sealed in the sealed vessel, the sealed vessel including an inert gas atmosphere or a nitrogen atmosphere; and a gas supplying device for supplying a nitrogen gas to the mixed molten liquid through each of the vessels.

8 Claims, 20 Drawing Sheets

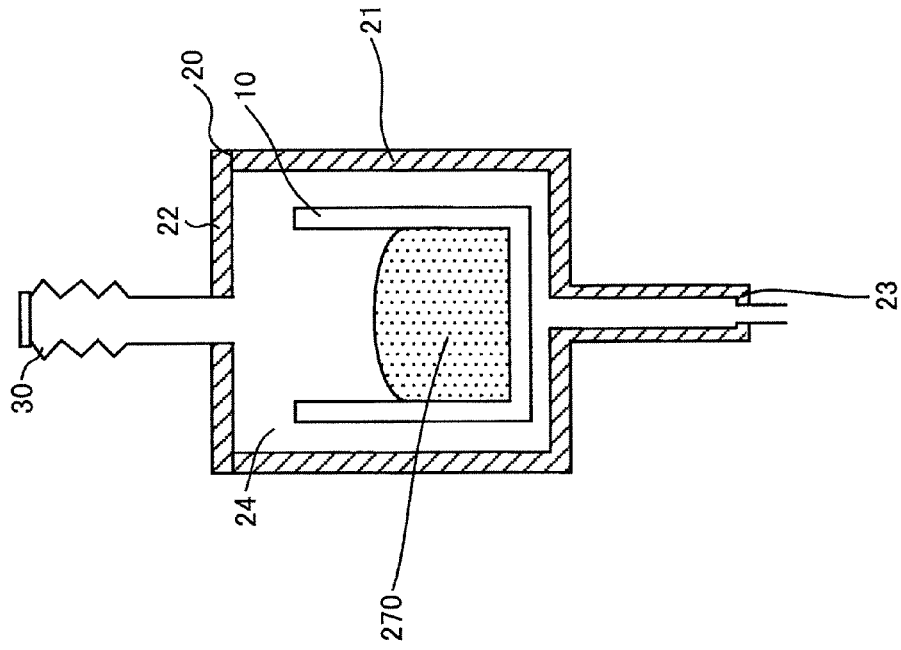
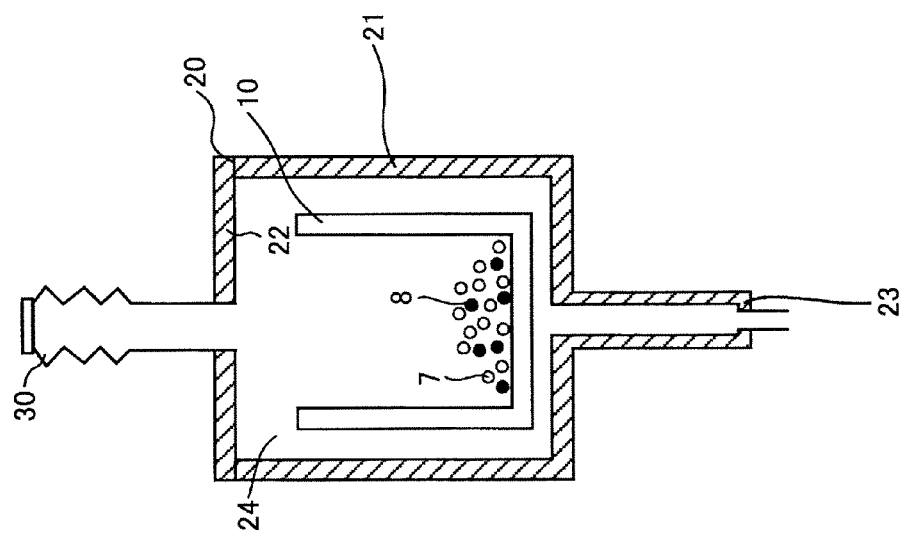

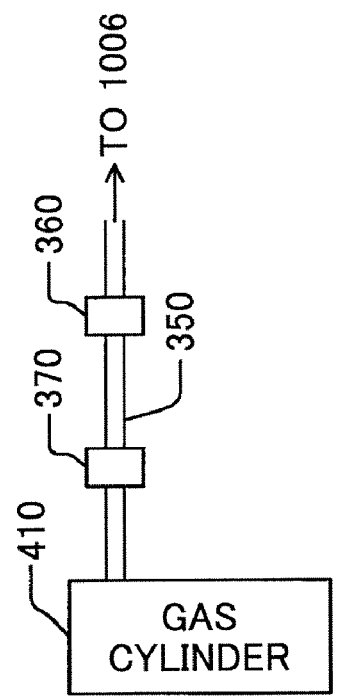
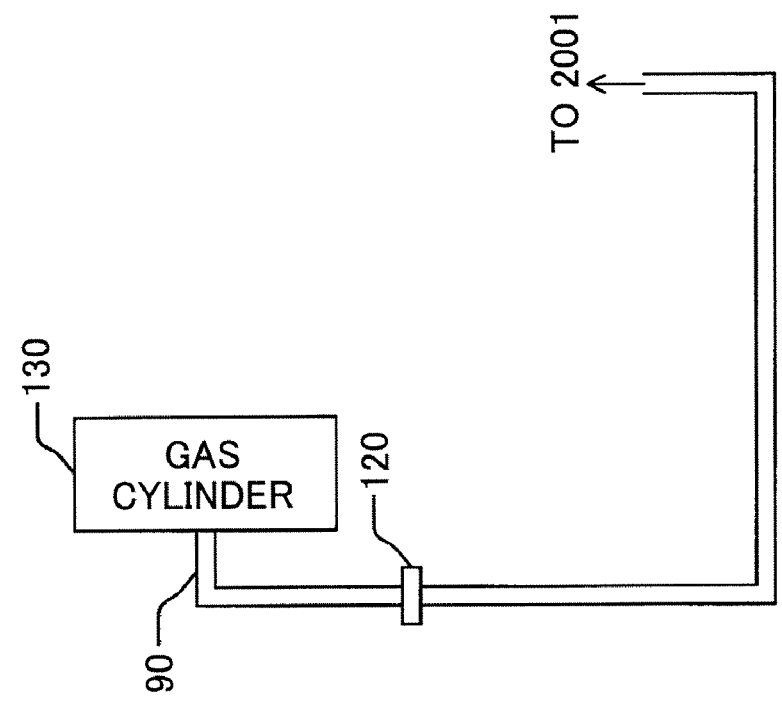

CRYSTAL MANUFACTURING APPARATUS

BACKGROUND OF THE INVENTION

1. Field of the Invention

The disclosures herein generally relate to a crystal manufacturing apparatus, and more specifically to a crystal manufacturing apparatus for manufacturing the group III nitride crystals.

2. Description of the Related Art

InGaAlN (a group III nitride semiconductor) related devices, used for light sources such as ultraviolet, violet, blue, and green, are fabricated mostly on sapphire or silicon carbide (SiC) substrates using a MOCVD (Metal Organic Chemical Vapor Deposition) method or a MBE (Molecular Beam Epitaxy) method and the like.

When a sapphire or a SiC substrate is used as a substrate for fabricating a group III nitride semiconductor, a large number of crystal defects are introduced into the group III nitride semiconductor because of large differences in the lattice constant and the thermal expansion coefficient between those substrates and a group III nitride semiconductor. The crystal defects degrade the device characteristics. For an example, the crystal defects shorten the device lifetime and cause a larger current operation and the like, which relate directly to disadvantages of the devices.

Further, a sapphire substrate is an insulating material and it does not allow forming electrodes on it unlike a conventional substrate. This requires forming electrodes on the group III nitride semiconductor; as a result the area of a device becomes larger, which raises its manufacturing cost. As the device area becomes larger, there is a different problem arising as a wafer bending due to a combination of hetero-materials of a sapphire substrate and a group III nitride semiconductor.

Further, the group III nitride semiconductor device fabricated on a sapphire substrate is difficult to cleave, so that forming mirror facets to provide a resonant cavity of a laser diode (LD) is not facilitated. Thereby, presently, such resonant cavity facets are formed by using a dry etching technique or thinning the sapphire substrate to be less than 100 μm thick with a polishing technique and scribing it for easy cleaving. Thus, there is a difficulty forming resonant cavity facets and cleaving chips in a single process unlike a conventional LD fabrication, which causes a high production cost due to complicated fabrication processes.

Then, a technique is proposed where a group III nitride semiconductor is selectively, laterally grown on a sapphire substrate for reducing crystal defects. This allows reducing crystal defects; however, the problems due to non-conductivity of the sapphire substrate and a difficulty of cleaving still remain.

To solve such problems, a gallium nitride (GaN) substrate, the same material as a crystal to be grown, is most preferable as a substrate. For this reason, crystal growth techniques, such as gas phase growth and liquid phase growth are proposed for growing a bulk GaN crystal. However, a high quality GaN substrate with a large diameter for practical use has not been achieved.

As a method for obtaining a GaN substrate, a method of GaN crystal growth using sodium (Na) flux is proposed (see reference 1). This method utilizes sodium azide ($NaN_3$) and metallic Ga as source materials that are placed in a reaction vessel (internal diameter: 7.5 mm, length: 100 mm) made of a stainless steel that is sealed with nitrogen atmosphere; the reaction vessel is heated to a temperature ranging 600° C.-800° C., and the temperature is maintained for a time period of 24-100 hours so that and then a GaN crystal is grown.

This method allows growing a crystal at a relatively low temperature 600° C.-800° C. with a relatively low pressure around 100 kg/cm² in the vessel. It may be characterized as a practical crystal growth condition.

Further, recently a high quality group III nitride crystal has been achieved by reacting a mixed molten liquid of an alkali metal and a group III metal with a group V source material containing nitrogen (see reference 2).

However, as a conventional flux method performs crystal growth under a pressure ranging from several MPa to 10 MPa, a double wall vessel is used for separating functions of pressure resistance and heat resistance, and then a larger size inner vessel is developed for growing a larger size crystal (e.g. reference 2). In the case of a conventional flux method, since alkali metals are used, a glove box controlling the moisture and oxygen concentration to be less than 1 ppm needs to be used for supplying the source materials of a group III metal and an alkali metal into the inner vessel in the glove box. Thereby, the inner vessel is taken out from the outer vessel after every crystal growth cycle. During this time period the outer side of the inner vessel, the outer vessel, and the parts between the outer vessel and the inner vessel are exposed to air. Thus heaters and thermal insulators as well any parts located inside the outer vessel are exposed to air. Further, part of a nitrogen gas introducing tube in the inner vessel is also exposed to air. Over the region exposed to air, moisture and oxygen are absorbed and desorbed when raising temperature of the region or introducing nitrogen gas into the region. As a result, the heaters and the thermal insulators are degraded, and their impurities are contained in the source materials so as to affect crystal growth. Further, in terms of detaching the inner vessel and parts associated with it, the reproducibility of thermal distribution becomes a problem. In addition, detaching and attaching the inner vessel or the parts cause time loss which increases the production cost.

To avoid such problems, reference 3 suggests connecting an atmosphere control part to the space between a source weighting part and an outer vessel of a crystal growth apparatus to prevent mixing the air.

Reference 4 suggests supplying alkali metal and a group III metal into a crucible in a inner vessel.

Reference 1 U.S. Pat. No. 5,868,837
Reference 2 Japanese Patent Application Publication No. 2003-313099
Reference 3 Japanese Patent Application Publication No. 2005-335983
Reference 4 Japanese Patent Application Publication No. 2004-292286

In reference 3, however, the outer vessel is a pressure resident vessel, and it is difficult to provide a gate valve that connects to the atmosphere control part and allows source materials to pass through the gate valve at the same time.

Reference 4 shows that there is a need to open an inner vessel to take out a grown crystal while there is no need to open the inner vessel when a source material is supplied.

What is needed is a crystal manufacturing apparatus that grows a group III nitride crystal without exposing parts inside of the outer vessel to air while avoiding detachment of an inner vessel.

SUMMARY OF THE INVENTION

It is a general object of at least one embodiment of the present invention to provide a crystal manufacturing apparatus that enables growing a group III nitride crystal without exposing parts inside of the outer vessel to air while avoiding detachment of an inner vessel.

In one embodiment, a crystal manufacturing apparatus for manufacturing a group III nitride crystal includes a crucible that holds a mixed molten liquid including an alkali metal and a group III metal, a reaction vessel accommodating the crucible in the reaction vessel, a heating device that heats the crucible with the reaction vessel, a holding vessel having a lid that is capable of opening and closing, accommodating the reaction vessel and the heating device in the holding vessel, a sealed vessel accommodating the holding vessel in the sealed vessel, having an operating device that enables opening the lid of the holding vessel for supplying source materials into the crucible and taking out a manufactured GaN crystal under a sealed condition, and closing the lid of the holding vessel that is sealed in the sealed vessel, wherein the sealed vessel includes an inert gas atmosphere or a nitrogen atmosphere in the sealed vessel, and a gas supplying device for supplying a nitrogen gas to the mixed molten liquid through each of the vessels.

In one embodiment, a crystal manufacturing apparatus for manufacturing the group III nitride crystals includes a crucible that holds a mixed molten liquid that includes an alkali metal and a group III metal, a reaction vessel accommodating the crucible in the reaction vessel, a heating device that is positioned at a predetermined relative location relative to the crucible, and heats the crucible through the reaction vessel, a sealed vessel accommodating the holding vessel in the sealed vessel, having an operating device that enables opening the lid of the holding vessel for supplying source materials into the crucible and taking out a manufactured GaN crystal under a sealed condition, and closing the lid of the holding vessel that is sealed in the sealed vessel, wherein the sealed vessel includes an inert gas atmosphere or a nitrogen atmosphere in the sealed vessel, a gas supplying device for supplying a nitrogen gas to the mixed molten liquid through each of the vessels, and a transfer mechanism that allows for the sealed vessel to be transferred relative to the reaction vessel and the heating device, or the reaction vessel and the heating device to be transferred relative to the sealed vessel, wherein the relative position between the reaction vessel and the heating device to be maintained, and the transfer mechanism providing the reaction vessel in the sealed vessel to be positioned at a first position when crystal growth is performed, and the reaction vessel in the sealed vessel to be positioned at a second position which is different from the first position when the source materials are supplied or the group III crystal is taken out.

According to the first or second a crystal manufacturing apparatus of the present invention, each of the crystal manufacturing apparatuses is capable of supplying the source materials and taking out the manufactured group III crystals without exposing the crucible, the reaction chamber, and the heating device to air. Thus it becomes possible to prevent exposing the parts inside of the outer vessel to air and manufacture the group III nitride crystals while avoiding detachment of an inner vessel. Then, it is possible to manufacture high quality GaN crystals continuously as well as efficiently without degradation of parts of the manufacturing apparatus.

BRIEF DESCRIPTION OF THE DRAWINGS

Other objects and further features of embodiments will become apparent from the following detailed description when read in conjunction with the accompanying drawings, in which:

FIGS. 6A and 6B are schematic diagrams for explaining the changes in each condition of source materials in a crucible;

FIGS. 17A-17D are diagrams for explaining identical component parts used in a second embodiment;

DESCRIPTION OF THE PREFERRED EMBODIMENTS

First Embodiment

Figure 1:
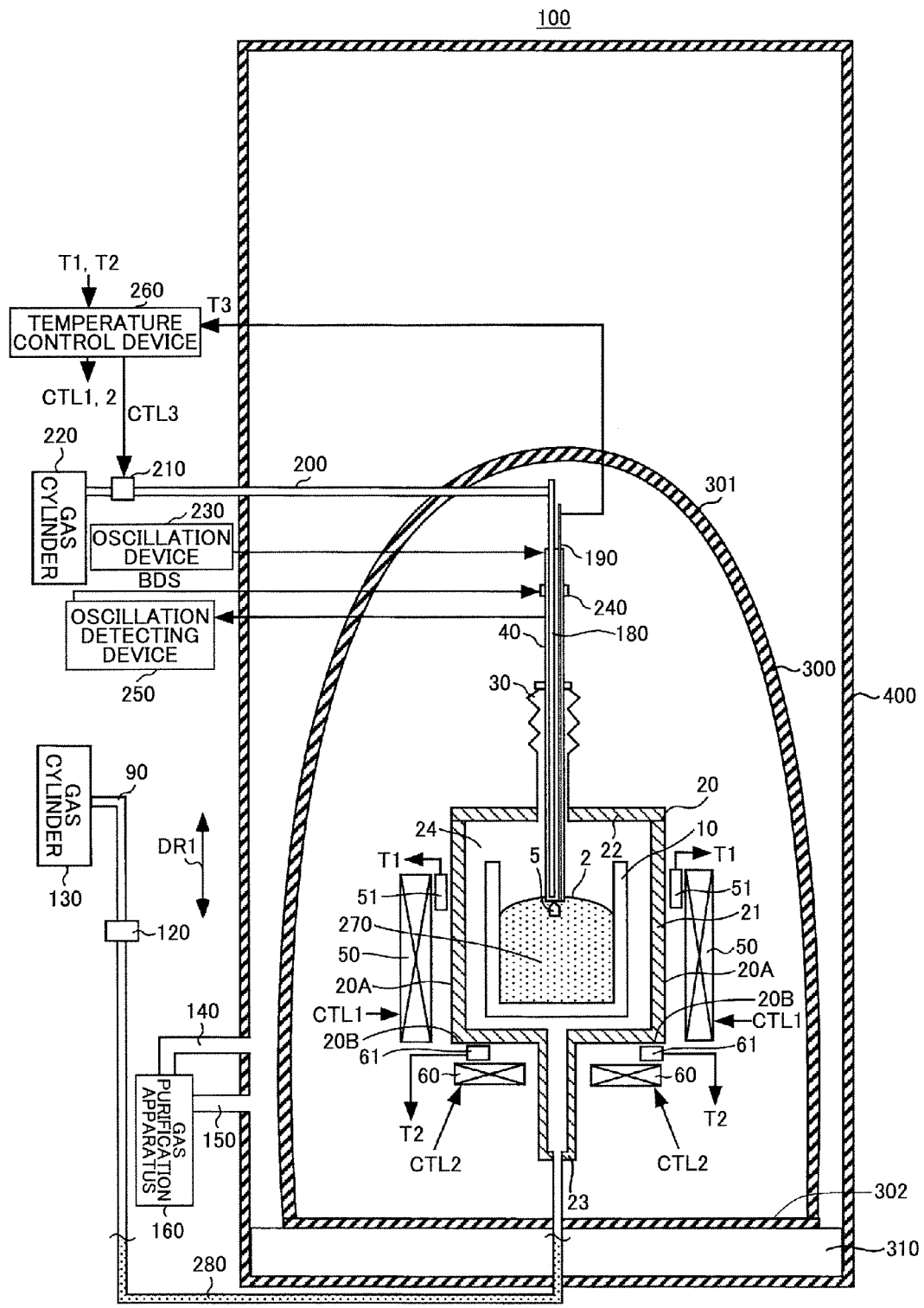
FIG. 1 is a schematic diagram of a crystal manufacturing apparatus in a view of cross section relating to a first embodiment of the present invention.

A first embodiment according to the present invention will be described by referring to FIG. 1-FIG. 11B. FIG. 1 shows a schematic diagram of a crystal manufacturing apparatus 100 related to a first embodiment of the present invention.

This crystal manufacturing apparatus 100 is for manufacturing a GaN crystal manufactured by supplying nitrogen gas to a mixed molten liquid that includes metallic sodium (Na) and metallic gallium (Ga). Thus, the crystal manufacturing apparatus 100 manufactures a GaN crystal by a flux method.

The crystal manufacturing apparatus 100 comprises a crucible 10, a reaction vessel 20, a bellows 30, a holding device 40, heating devices (50, 60), temperature sensors (51, 61), gas supplying tubes (90, 200), a pressure control device 120, gas cylinders (130, 220), a gas purification apparatus 160, pipes (140, 150, 180), a thermocouple 190, a flow meter 210, an oscillation device 230, an up/down mechanism 240, an oscillation detecting device 250, a temperature control device 260, a holding vessel 300, a base flange 310, and a sealed vessel 400.

Each gas cylinder (130 and 220) is filled with nitrogen gas.

The crucible 10 is constructed of boron nitride (BN) with a circular contour or made of austenitic stainless steel ("SUS316L"). The crucible 10 holds a mixed molten liquid 270 including metallic Na and metallic Ga, and is accommodated in a reaction vessel 20.

The reaction vessel 20 comprises a body part 21, a lid part 22, and a pipe connecting part 23. The body part 21, the lid part 22, and the pipe connecting part 23 are made from SUS316L. A gap between the body part 21 and the lid part 22 is sealed with a metallic O-ring. Further, the pipe connecting part 23 is provided at the bottom plane of the body part 21.

The bellows 30 is connected to the lid part 22 of the reaction vessel 20 in the gravitational direction DR1. The bellows 30 holds the holding device 40 and seals the reaction vessel 20 from the outer part of it. Further, the bellows 30 stretches or shrinks in the gravitational direction DR1 with the holding device 40 transferring in the gravitational direction DR1.

The heating device 50 is placed to surround an outer surface 20A of the reaction vessel 20. The heating device 50 comprises a heater and a current source, in which a current determined by a control signal CTL1 of the temperature control device 260 is supplied from the current source to the heater.

The heating device 60 is placed to face a bottom 20B of the reaction vessel 20. The heating device 60 comprises another heater and another current source, in which a current determined by a control signal CTL2 of the temperature control device 260 is supplied from the current source to the heater The temperature sensor 51 is placed close to the heating device 50, detects a temperature (T1) of the heating device 50, and outputs the detected result to the temperature control device 260.

The temperature sensor 61 is placed close to the heating device 60, detects a temperature (T2) of the heating device 60, and outputs the detected result to the temperature control device 260.

For the gas supplying tube 90, one end is connected to the pipe connecting part 23 of the reaction vessel 20, and the other end is connected to the gas cylinder 130. In part of the gas supplying tube at the side of the pipe connection part 23, a metallic Na molten liquid 280 is held.

The pressure control device 120 is provided in the way (the gas cylinder 130 side) of the gas supplying tube 90 and adjusts the pressure of nitrogen gas flowing from the gas cylinder 130 at a predetermined pressure.

As an example, the holding vessel 300 made of SUS316L accommodates the reaction vessel 20, the holding device 40, the heating devices (50, 60), and the temperature sensors (51, 61) in it. The holding vessel 300 comprises a body part 301 and a base part 302. The body part 301 and the base part 302 are connected with a metallic O-ring and bolts (not shown). The base part 302 is fixed on a base flange 310. Further, the holding vessel 300 is cooled with cooling water and is a pressure-resistant vessel capable of operating high pressure.

The sealed vessel 400, for example, is made of SUS316L and accommodates the base flange 310 and the holding vessel 300. The sealed vessel 400 includes at least a pair of gloves (not shown) so that an operator can use them for work in the sealed vessel 400. Therefore, the sealed vessel 400 functions as a glove box. The inside of the sealed vessel is isolated from air and maintains a high purity nitrogen atmosphere.

The sealed vessel 400 comprises a source reserve chamber (not shown) for reserving metallic Na and metallic Ga and a crystal storage chamber (not shown) for storing fabricated GaN crystal. The source reserve chamber includes a supplement mechanism that is capable of supplying source materials into the source reserve chamber from the outside of the sealed vessel 400 almost without changing the atmosphere in the sealed vessel 400.

The crystal storage chamber includes a take-out mechanism that is capable of taking out GaN crystal stored in the storage chamber to the outside of the sealed vessel 400 almost without changing the atmosphere in the sealed vessel 400.

The base flange 310 is fixed on a basal plane of the sealed vessel 400.

The gas purification apparatus 160 is connected to the sealed vessel 400 through the pipe 140 and the pipe 150. The gas purification apparatus 160 removes impurities such as oxygen and moisture included in gas taken from the sealed vessel 400 through the pipe 140 and returns the gas to the sealed vessel 400 through the pipe 150. Thereby, the concentration of oxygen and moisture of the gas in the sealed vessel 400 is maintained at less than 1 ppm.

For example, the oscillation device 230 includes a piezoelectric device that applies oscillations at a predetermined frequency for the holding device 40.

As an example, the oscillation detecting device 250 includes an acceleration pick-up device to detect the oscillation of the holding device 40, and outputs the detected results to the up/down mechanism 240 as an oscillation detected signal.

One end of the gas supplying tube 200 is connected to the pipe 180 and the other end of that is connected to the gas cylinder 220 through the flow meter 210.

The gas flow meter 210 adjusts the flow rate of the nitrogen gas from the gas cylinder 220 to a predetermined flow rate according to a control signal CTL3 of the temperature control device 260.

Figure 2A:
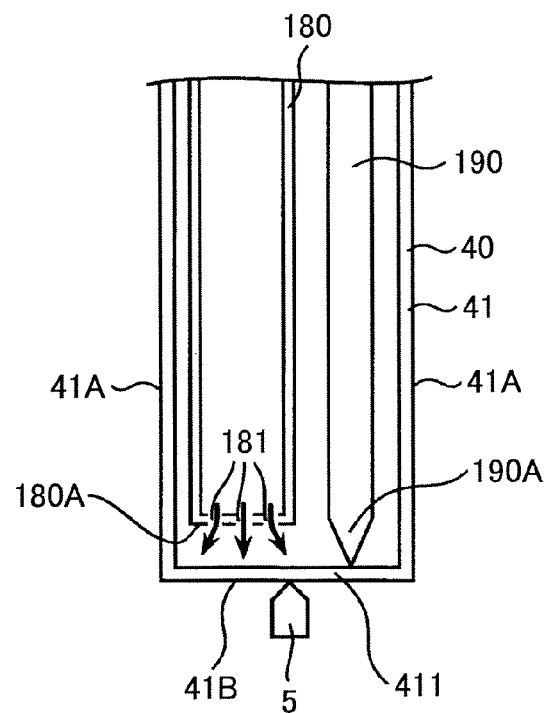
FIGS. 2A and 2B are enlarged views of the end of a holding device shown in FIG. 1.
Figure 2B:
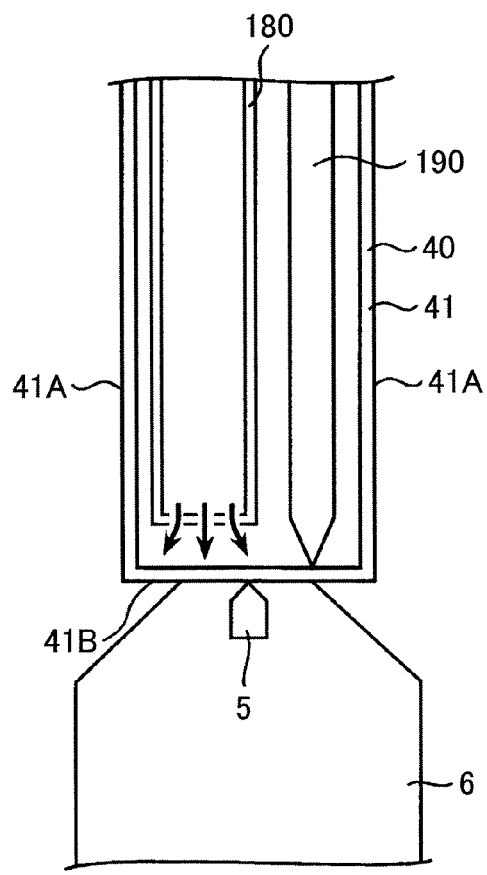

As an example, an enlarged view of the parts of the holding device 40, the pipe 180, and the thermocouple 190 is shown in FIG. 2A and FIG. 2B.

The holding device 40 includes a cylindrical part 41. One end of the cylindrical part 41 is inserted into a space 24 in the reaction vessel 20 through an opening provided in the lid part 22 of the reaction vessel 20. Further, a seed crystal 5 is attached on the bottom plane 41B outside of the cylindrical part 41 (see, FIG. 2A). A GaN crystal 6 including the seed crystal 5 grows on the bottom plane 41B of the cylindrical part 41 (see FIG. 2B). The holding device 40 holds the grown GaN crystal 6.

The pipe 180 has a round-shaped cross section and is positioned in the cylindrical part 41 of the holding device 40. Further, the bottom 180A of the pipe 180 is positioned to face the bottom plane 41B of the cylindrical part 41. Plural holes 181 are formed through the bottom 180A of the pipe 180.

Nitrogen gas from the gas cylinder 220 having a flow rate adjusted by the flow meter 210 is supplied to the inside of the holding device 40 and flows through the plural holes 181 to the bottom 41B of the cylindrical part 41. Thereby, the seed crystal 5 and the GaN crystal 6 are cooled.

Further, the nitrogen gas flowing in the cylindrical part 41 flows out of the crystal manufacturing apparatus 100 through openings provided in the cylindrical part 41, which openings are not shown in the figure.

For the thermocouple 190, an end 190A is positioned in the cylindrical part 41 to contact the bottom plane 41 B. The thermocouple 190 detects the temperature (temperature T3) of the seed crystal 5 or the GaN crystal 6 and outputs the detected result to the temperature control device 260.

Figure 3:
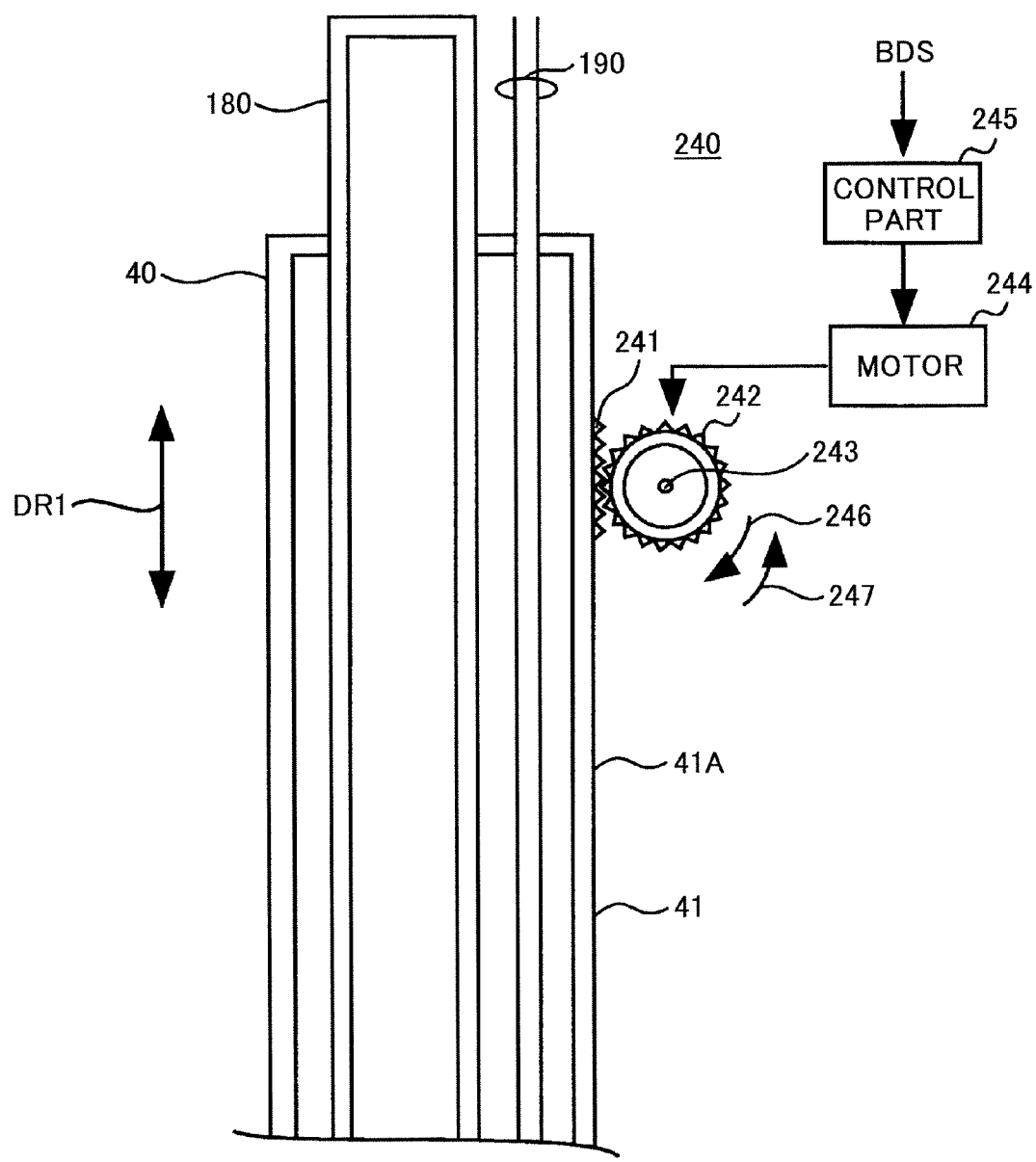
FIG. 3 is a schematic diagram for explaining a structure of an up/down mechanism shown in FIG. 1.

The up/down mechanism 240 is placed on the holding device 40 at the upper side of the bellows 30. The up/down mechanism, as shown in FIG. 3 as an example, includes a concavo-convex part (rack) 241, a gear 242, a shaft part 243, a motor 244, and a control part 245.

The concavo-convex part 241 has a triangular shaped cross section and is fixed on the outer surface 41A of the cylindrical part 41. The gear 242 is fixed on one end of the shaft part 243 and placed to engage with the concavo-convex part 241.

On the shaft part 243, one end is joined with the gear 242 and the other end joined with the shaft (not shown) of the motor 244. The motor 244 turns the gear 242 to in the direction of an arrow 246 or an arrow 247 according to the indication of the control part 245.

The control part 245 controls the motor 244 for turning the gear 242 in the direction of the arrow 246 or the arrow 247 according to an oscillation detection signal BDS of the oscillation detecting device 250.

The holding device 40 is moved upward in the gravitational direction DR1 when the gear 242 turns in the arrow 246 direction, and the holding device 40 is moved downward in the gravitational direction DR1 when the gear 242 turns in the direction of the arrow 247.

Figure 4:
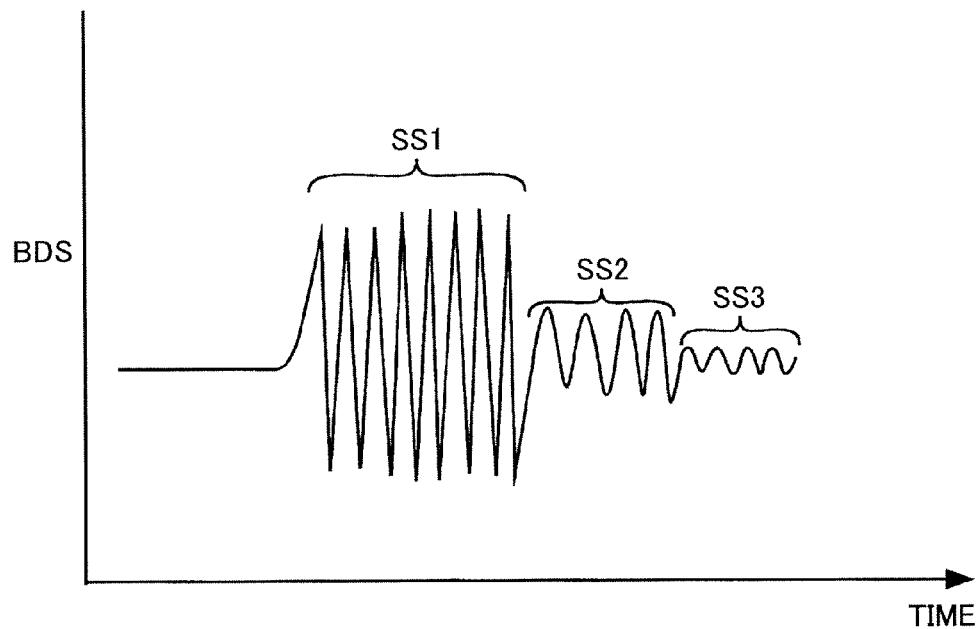
FIG. 4 shows a timing chart of signals detected by an oscillation detecting device.

For examples a timing chart of the oscillation detection signal BDS is shown in FIG. 4. As the holding device 40 is widely oscillated due to oscillation applied by the oscillation device 230 when the holding device 40 does not touch the mixed molten liquid 270, the oscillation detection signal BDS shows a relatively large signal wave SS1. (B) The oscillation detection signal BDS becomes a relatively small signal wave SS2, since the holding device 40 is not oscillated widely for the oscillation applied by the oscillation device 230 due to the viscosity of the mixed molten liquid 270 when the holding device 40 is touching the mixed molten liquid 270. (C) When part (or GaN crystal 6) of the holding device 40 is immersed in the mixed molten liquid 270, the effect of the viscosity becomes larger, so that it becomes more difficult for the holding device 40 (or GaN crystal 6) to be oscillated by the oscillation applied by the oscillation device 230. As a result, the oscillation detection signal BDS shows that the amplitude of the signal wave SS3 is smaller than that of the signal wave SS2.

During growing a crystal, the control part 245 detects the signal wave of the oscillation detection signal BDS for every predetermined timing. When the detected signal wave is SS1, the control part 245 controls the motor 244 for moving the holding device 40 downward in the gravitational direction DR1 until the detected signal wave becomes SS2 or SS3.

Further, the control part 245 controls the motor 244 to stop turning the gear 242 when the signal wave of the oscillation detection signal BDS becomes SS2 or SS3. Thereby, during crystal growth, one end of the holding device 40 can be maintained in a gas-liquid interface 2 or the one end of the holding device 40 can be maintained in the mixed molten liquid 270.

The temperature control device 260 generates a control signal CTL1 based on the temperature T1 for heating the crucible 10 and the reaction vessel 20 at the temperature of crystal growth, and generates a control signal CTL2 based on the temperature T2 for heating the crucible 10 and the reaction vessel 20 at the temperature of crystal growth. Further, the temperature control device 260 generates the control signal CTL3 based on the temperature T3 for supplying nitrogen gas with a proper flow rate to control the temperature of the seed crystal 5 or the GaN crystal 6 to be lower than the temperature of crystal growth.

Further, the temperature control device 260 outputs the generated control signal CTL1 to the heating device 50, the control signal CTL2 to the heating device 60, and the control signal CTL3 to the flow meter 210.

Fabrication Method of GaN Crystal

Figure 5:
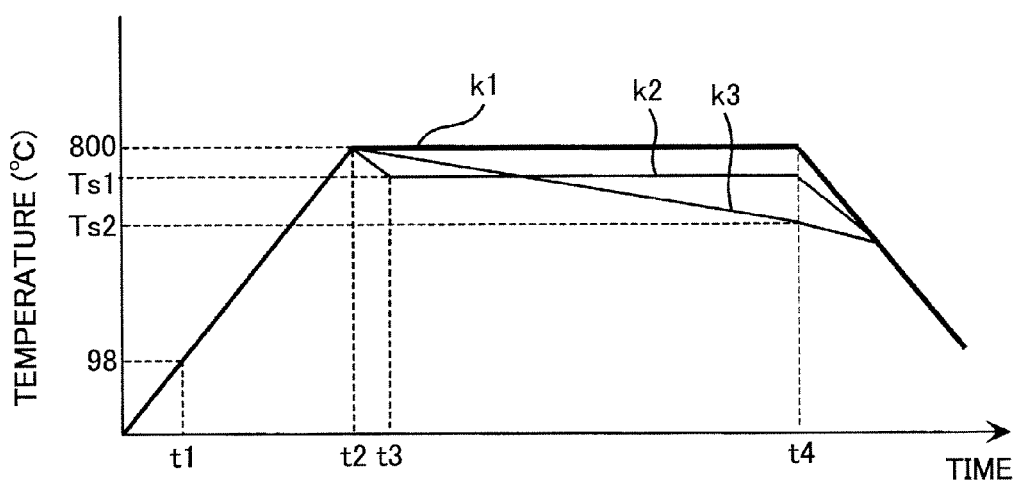
FIG. 5 is a timing chart indicating changes in temperatures of a crucible and a GaN crystal.
Figure 7:
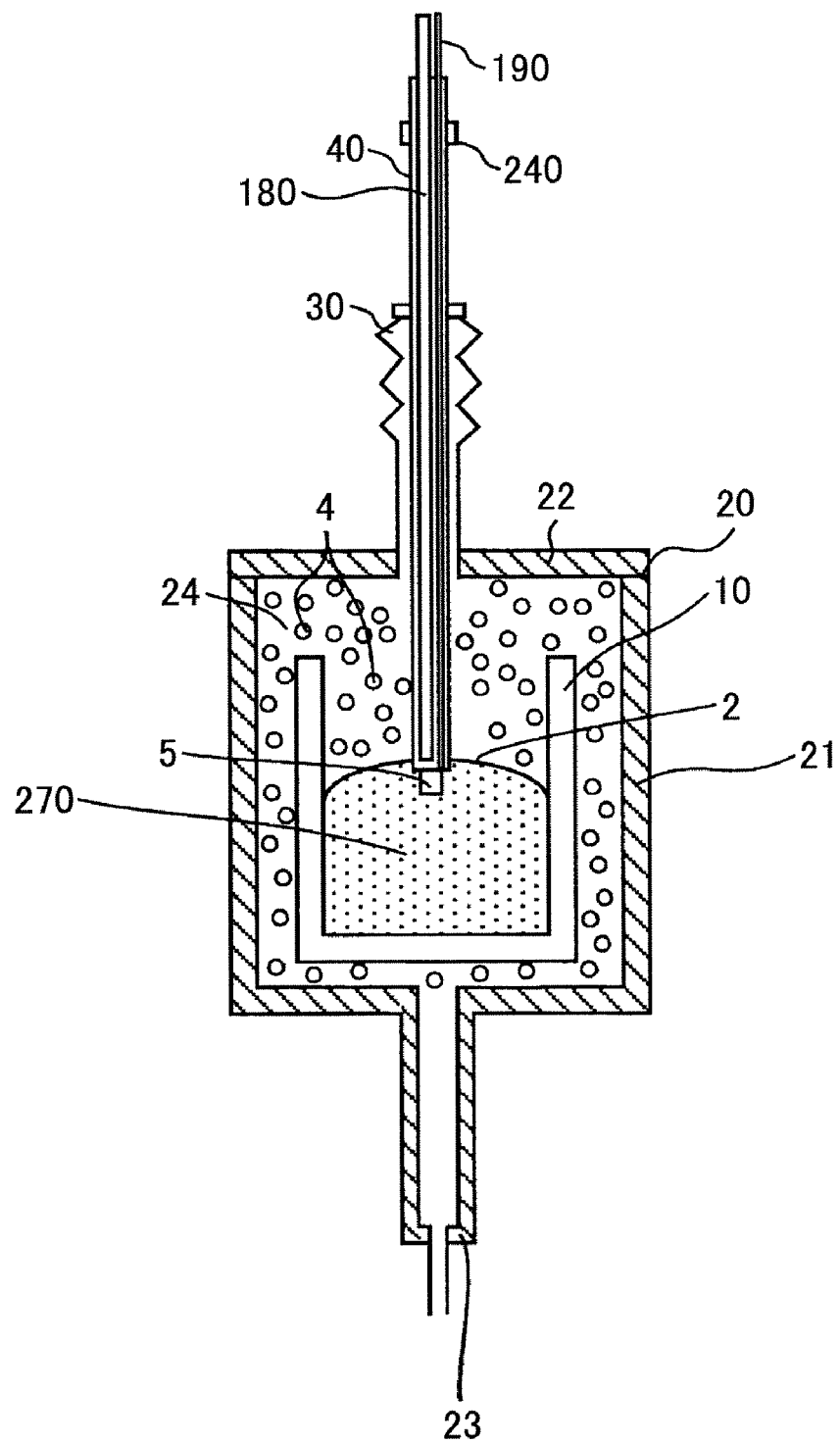
FIG. 7 is a schematic diagram for explaining the condition of the crucible and the inside of the reaction vessel at a timing t2 indicated in FIG. 5.

Fabrication method using the crystal manufacturing apparatus 100 of the construction shown above will be explained by referring to FIG. 5-FIG. 11B. FIG. 5 is a timing chart showing the changes in temperatures of the crucible 10 and GaN crystal 6. FIG. 5 shows that the thick line k1 indicates the change in the temperature of the crucible 10, and thin lines k2 and k3 indicate the temperature of the GaN crystal 10 for two cases (Case A and Case B). Further, a flow chart in FIG. 10 shows the sequence of operations by an operator.

(1-1) Within the sealed vessel 400, use a pair of gloves installed at the sealed vessel 400 and take off a bolt (not shown) connecting the body part 301 and the base part 302.

(1-2) In the vessel 400, open the holding vessel 300 by moving the body part 301 of the holding vessel 300 upward.

(1-3) In the sealed vessel 400, open the reaction vessel 20 by removing the lid 22 of the reaction vessel 20 (step s1). Under that condition, the atmosphere in the sealed vessel 400 is a nitrogen gas atmosphere or an inert gas (such as Argon) atmosphere, and the inner pressure has a positive pressure by 0.1 atmospheric pressure compared to the atmospheric pressure. In that case, the inner atmosphere of the sealed vessel 400 is nitrogen gas or an inert gas (such as Argon), and the inner pressure is a positive pressure of about 0.1 atmospheric pressure above the atmospheric pressure.

(1-4) In the sealed vessel 400, take out a metallic Na and a metallic Ga from the source reserve chamber and supplys them into the crucible 10 with a ratio of amounts 1:1 (Step S2). Further, attach the seed crystal 5 onto the one end of the holding device 40 (See FIG. 11A).

(1-5) In the sealed vessel 400, attach the lid part 22 of the reaction vessel 20 to the body part 21.

(1-6) In the sealed vessel 400, move the body part 301 of the holding vessel 300 downward, and place the body part 301 on the base part 302. Then connect the body part 301 and the base part 302 with the bolt. Thereby, the reaction vessel 20 and the holding vessel 300 can be closed within the sealed vessel 400 (Step S3).

(1-7) Introduce nitrogen gas through the gas supplying tube 90 until the pressure in the reaction vessel 20 and the gas supply tube reaches 1.01 MPa (Step S4). In a case where the inner atmosphere of the sealed vessel 400 is not a nitrogen gas atmosphere in the step 1, perform purging with nitrogen gas to replace with it.

(1-8) Heat the crucible 10 through the reaction vessel 20 by using each heating device (50, 60) (Step S5). In the present case, the temperature of crystal growth is 800° C.

The metallic Na 7 and the metallic Ga 8 in the crucible 10 are solid state before the crucible 10 is heated. When the temperature of the crucible 10 reaches approximately 30° C., the metallic Ga 8 becomes liquid state.

Further, when the temperature of the crucible 10 reaches 98° C. (timing t1 in FIG. 5), the metallic Na 7 in the crucible 10 becomes liquid state and mixes with the metallic Ga 8 that is melted previously. Thereafter, a metallic compound of Ga and Na is formed, and the metallic compound becomes a mixed molten liquid 270 at a temperature of 560° C. (See FIG. 6B). Further the pressure of the nitrogen gas 4 is adjusted by the pressure control device 120, and the nitrogen gas 4 is supplied into the space 24 through the gas supplying tube 90 (See FIG. 7).

During the process where the crucible 10 is heated up to 800° C., the vapor pressure of the metallic Na evaporated from the mixed molten liquid 270 becomes gradually higher, and the evaporated metallic Na stays in a low temperature part of the gas supplying tube 90 as a molten liquid metallic Na 280.

In the region of the gas supplying tube 90 where the metallic Na molten liquid stays, the temperature is maintained by a heater (not shown) at a proper temperature to maintain the metallic Na in liquid state for preventing its actual evaporation. The actual temperature of metallic Na for preventing evaporation is, for example, 200~300° C.

The vapor pressure of Na at 200° C. is approximately $1.8 \times 10^{-2}$ Pa and 1.8 Pa at 300° C. Thereby, this can reduce a fluctuation of the mixture ratio of metallic Na and metallic Ga in the mixed molten liquid 270.

(1-9) When the temperature of the crucible 10 reaches 800° C. (timing t2 in FIG. 5), immerse the seed crystal 5 into the mixed molten liquid 270 by using the up/down mechanism 240 (Step S6).

Under a high temperature condition where the temperature of the crucible 10 is approximately 800° C., the nitrogen gas 4 in the space 24 is incorporated into the mixed molten liquid 270 via the metallic Na playing as mediator. A nitrogen concentration or a concentration of $Ga_xN_y$ (x, y are real numbers) in the mixed molten liquid 270 is maximum at around the interface of gas-liquid 2, so that the GaN crystal 6 is grown from the seed crystal 5 (See FIG. 11B). Under this condition, the temperature of the crucible 10 and the nitrogen gas pressure in the reaction vessel 20 correspond to a temperature and a pressure in a region REG3 as indicated in FIG. 9.

Figure 9:
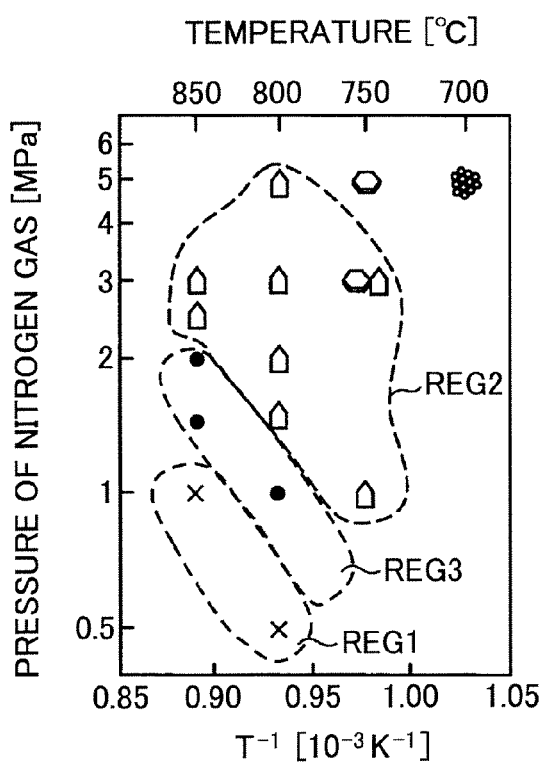
FIG. 9 is a graph for explaining the relationship between the pressures of nitrogen gas and the temperature of crystal growth for growing a GaN crystal.
Figure 10:
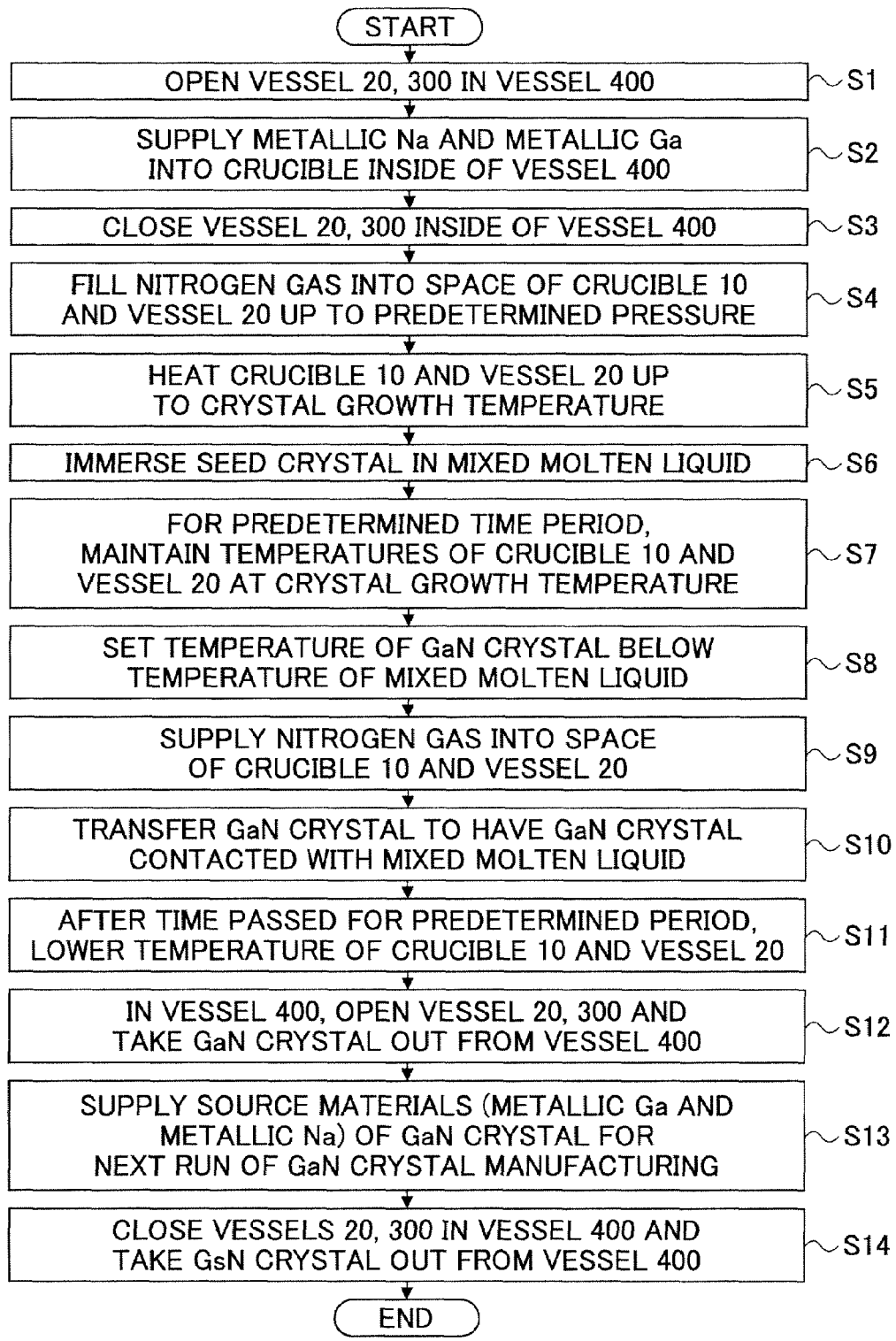
FIG. 10 is a flowchart for explaining a manufacturing method of a GaN crystal using the crystal manufacturing apparatus in FIG. 1.
Figure 11A:
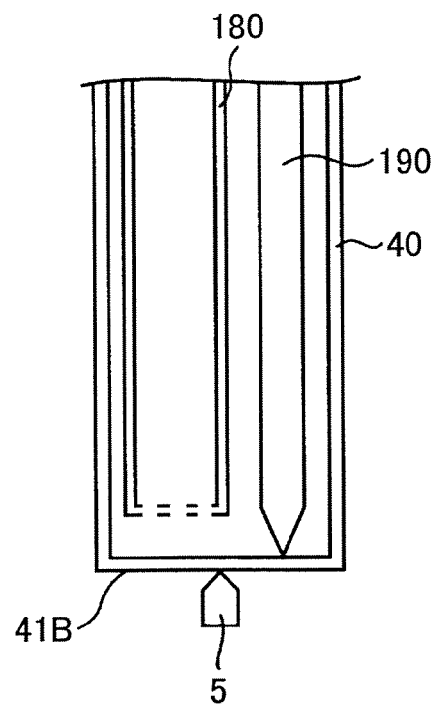
FIGS. 11A and 11B are schematic diagrams for explaining a growing process of a GaN crystal.
Figure 11B:
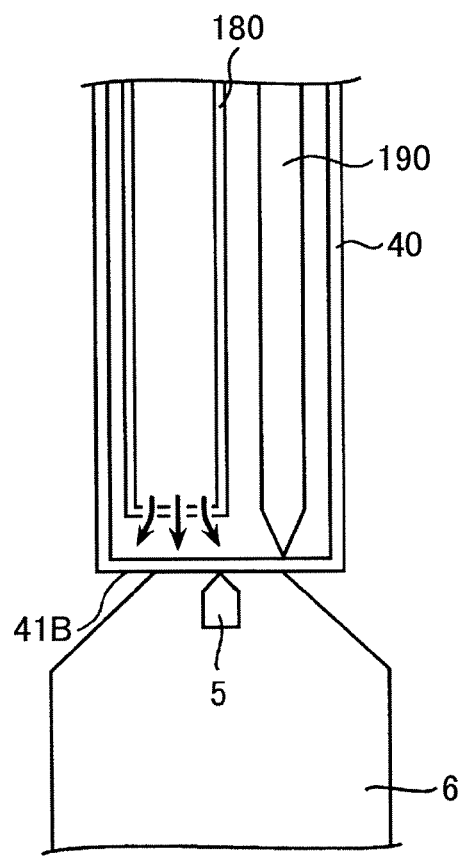

FIG. 9 shows that REG1 is a region where a GaN crystal is melted. REG2 is a region where a large number of self-nucleation is formed on a bottom and a side surface of that contacts with the mixed molten liquid 270 in the crucible 10, and columnar GaN crystals are grown in a C-axis (<0001>) direction. REG3 is a region where a GaN crystal grows from the seed crystal.

(1-10) For a predetermined time period (several hours), the temperature of the crucible 10 is held at 800° C. (Step S7).

(1-11) Once the crystal growth of a GaN crystal starts, nitrogen gas is supplied into the pipe 180 and cools the GaN crystal 6 to be lower than the temperature (=800° C.) of the mixed molten liquid 270 (Step S8) to increase the degree of supersaturation of the nitrogen in the mixed molten liquid 270 or $Ga_xN_y$ (real numbers x, y) near the GaN crystal 6. Thereby, the crystal growth of the GaN crystal 6 is maintained.

When the temperatures T1 and T2 reach 800° C.+α° C., two methods are considered; method A is that the temperature of GaN crystal 6 is reduced to Ts1 (e.g. 790° C.) and maintained at the temperature (Case A) as indicated with a thin line k2 in FIG. 5; method B is that the temperature of the GaN crystal 6 is gradually reduced toward the temperature Ts2 (e.g., 750° C.) as indicated with a thin line k3 in FIG. 5 (Case B). The temperature, 800° C.+α° C., indicates the temperature of heaters used in each heating device (50, 60) to increase a temperature of the crucible 10 to 800° C. The temperature control device 260 is programmed for response to either the method A or the method B.

More particularly, for the method A, when the temperature T1 and temperature T2 reach 800° C.+α° C., the temperature control device 260 immediately generates a control signal CTL3 and outputs it to the flow meter 210 for supplying a proper flow rate fr1 (sccm) of nitrogen Gas through the flow meter 210 to control the temperature of the GaN crystal 6 to be Ts1. Thereby, the temperature of the GaN crystal 6 decreases in a short period of time and becomes constant at a temperature of Ts1.

Figure 8:
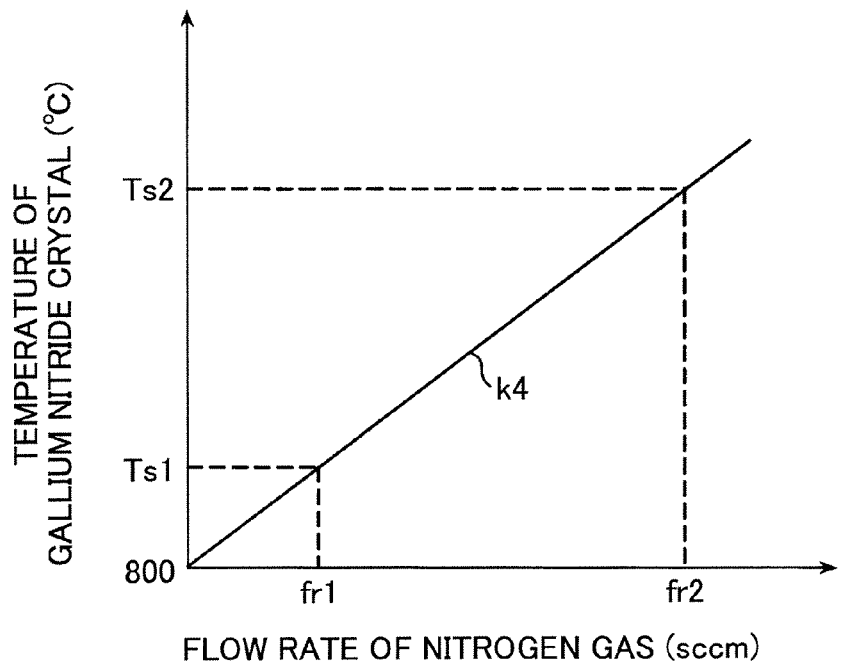
FIG. 8 is a graph for explaining the relationship between temperatures of a GaN crystal and flow rates of nitrogen gas.

Further, for the method B, when the temperature T1 and temperature T2 reach 800° C.+α° C., the temperature control device 260 generates a control signal CTL3 and outputs it to the flow meter 210 for gradually increasing the flow rate of the nitrogen gas in a predetermined period of time from a flow rate 0 to a flow rate fr2 (sccm) (See FIG. 8). Thereby, the temperature of the GaN crystal 6 is gradually reduced toward t the temperature of Ts2.

While the crystal growth of GaN is proceeding, the nitrogen gas in the space 24 is consumed; as a result the nitrogen gas in the space 24 is decreased. Then a pressure P1 in the space 24 becomes lower than a pressure P2 in the gas supplying tube 90 on the side of the pressure control device 120 (P1<P2), and the nitrogen gas in the gas supplying tube 90 (the side of the pressure control device 120) is supplied into the space 24 through the molten liquid metallic Na 280. Thus, the nitrogen gas is supplied in to the space 24 (Step S9).

(1-12) Move the GaN crystal 6 to put the GaN crystal 6 with the mixed molten liquid 270 (Step S10). Thereby, the GaN crystal 6 in contact grows to a large size.

(1-13) After passing a predetermined period of time (timing t4 in FIG. 5), heating using each heating device (50, 60) is stopped. Thereby, the temperature of the crucible 10 is reduced (Step S11).

(1-14) When the temperature of the crucible 10 and the reaction vessel 20 reach room temperature, the same operational sequence described above (1-1)~(1-3) is performed.

(1-15) Take the GaN crystal out of the crucible 10, and put it in the crystal store chamber (Step S12).

(1-16) The same operational sequence as described above (1-4)~(1-7) is performed, and preparation for a next run of GaN crystal growth is performed.

(1-17) The same operational sequence as described above (1-8)~(1-15) is performed for manufacturing a GaN crystal.

After this, the same operational sequences as (1-16) and (1-17) are repeatedly performed when necessary.

When the amounts of the metallic Na and metallic Ga reserved in a source store chamber (not shown) are decreased, the operator supplies the metallic Na and metallic Ga to the source store chamber from the outside of the sealed vessel 400 with a supply mechanism almost without changing the atmosphere in the sealed vessel 400.

Further, it is possible for the operator to take the GaN crystal stored in the crystal store chamber (not shown) out of the sealed vessel 400 using a take-out mechanism (not shown) almost without changing the atmosphere in the sealed vessel 400.

As described above, for the crystal manufacturing apparatus 100 related to the first embodiment of the present invention, "a gas supply apparatus" comprises a gas supplying tube 90, a pressure control device 120, and a gas cylinder 130.

Further, "a method of operation" includes at least a pair of gloves.

As described above, according to the crystal manufacturing apparatus 100 relating to the first embodiment of the present invention, it enables supplying source materials (metallic Ga and metallic Na) into the crucible 10, and taking the manufactured GaN crystal out of the crucible 10 in the sealed vessel 400 filled with nitrogen gas. Thus, manufacturing a GaN crystal can be performed without exposing parts such as each heating device (50, 60) in the holding vessel 300 to air. Then, it is possible to manufacture high quality GaN crystals continuously as well as efficiently without degradation of parts of the manufacturing apparatus.

There is no need of a preliminary gas purge to prevent releasing impurity gases from the comprising parts of the manufacturing apparatus, and it enables shortening the operating time. Thereby, this allows manufacturing products at lower cost.

Further, moving the reaction vessel 20 becomes unnecessary, and this allows preventing changes in relative position between the reaction vessel 20 and each heating device (50, 60). Thereby, it becomes possible to perform crystal growth maintaining the same conditions. Thus, it enables manufacturing the same quality of GaN crystals constantly.

Second Embodiment

Figure 12:
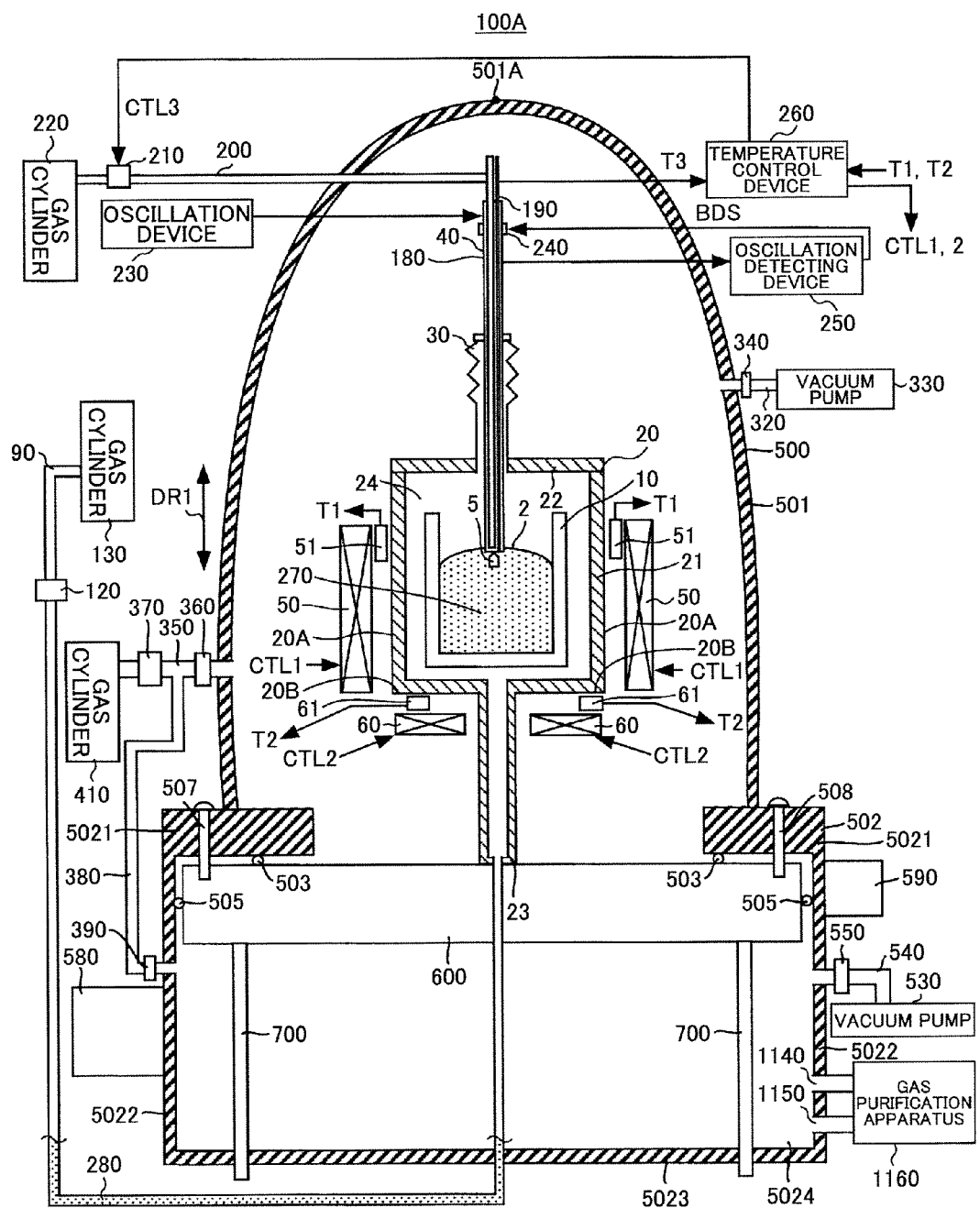
FIG. 12 is a schematic cross-sectional diagram of a crystal manufacturing apparatus related to a second embodiment of the present invention.
Figure 13:
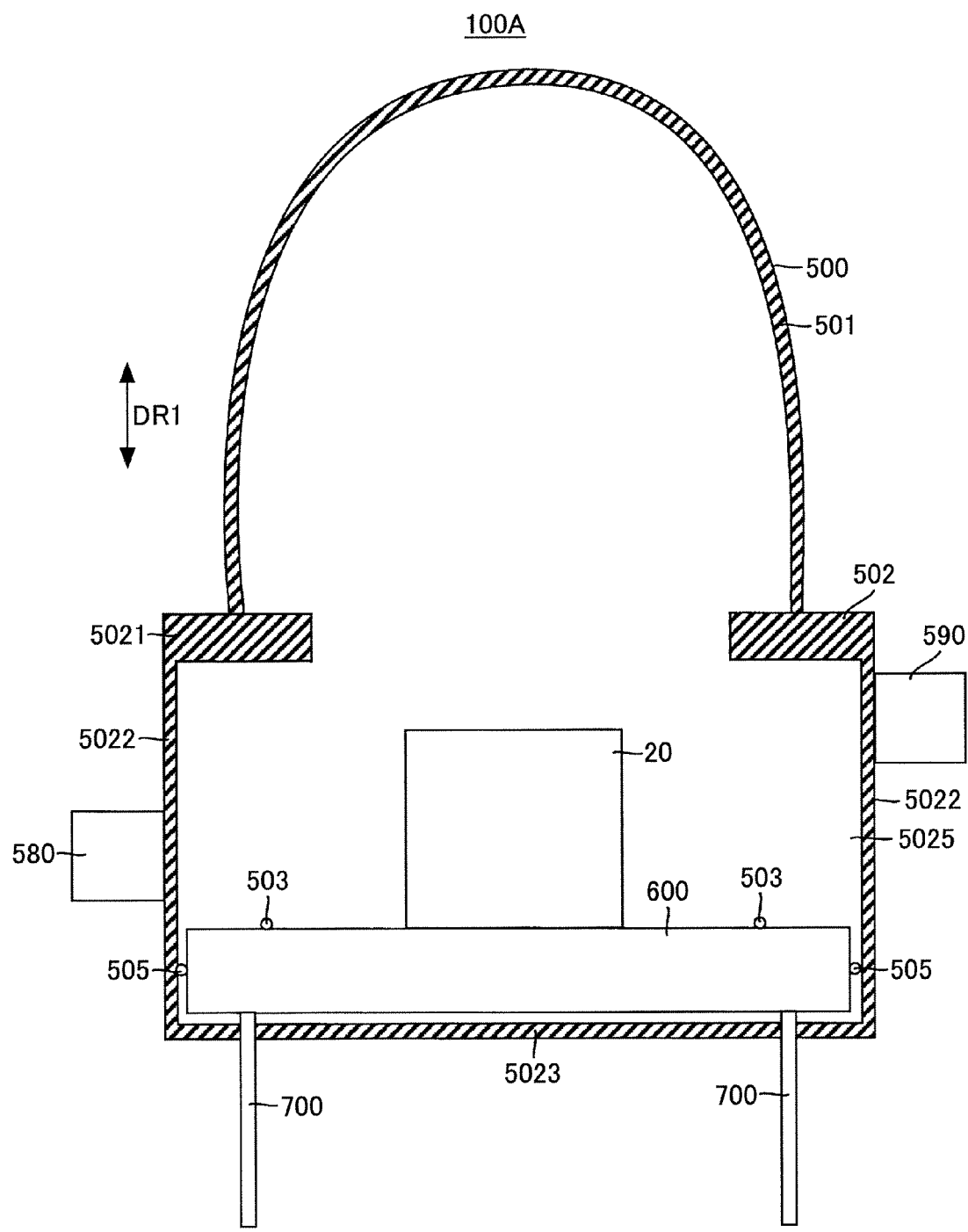
FIG. 13 is a schematic diagram for explaining the transfer of the sealed vessel.
Figure 14:
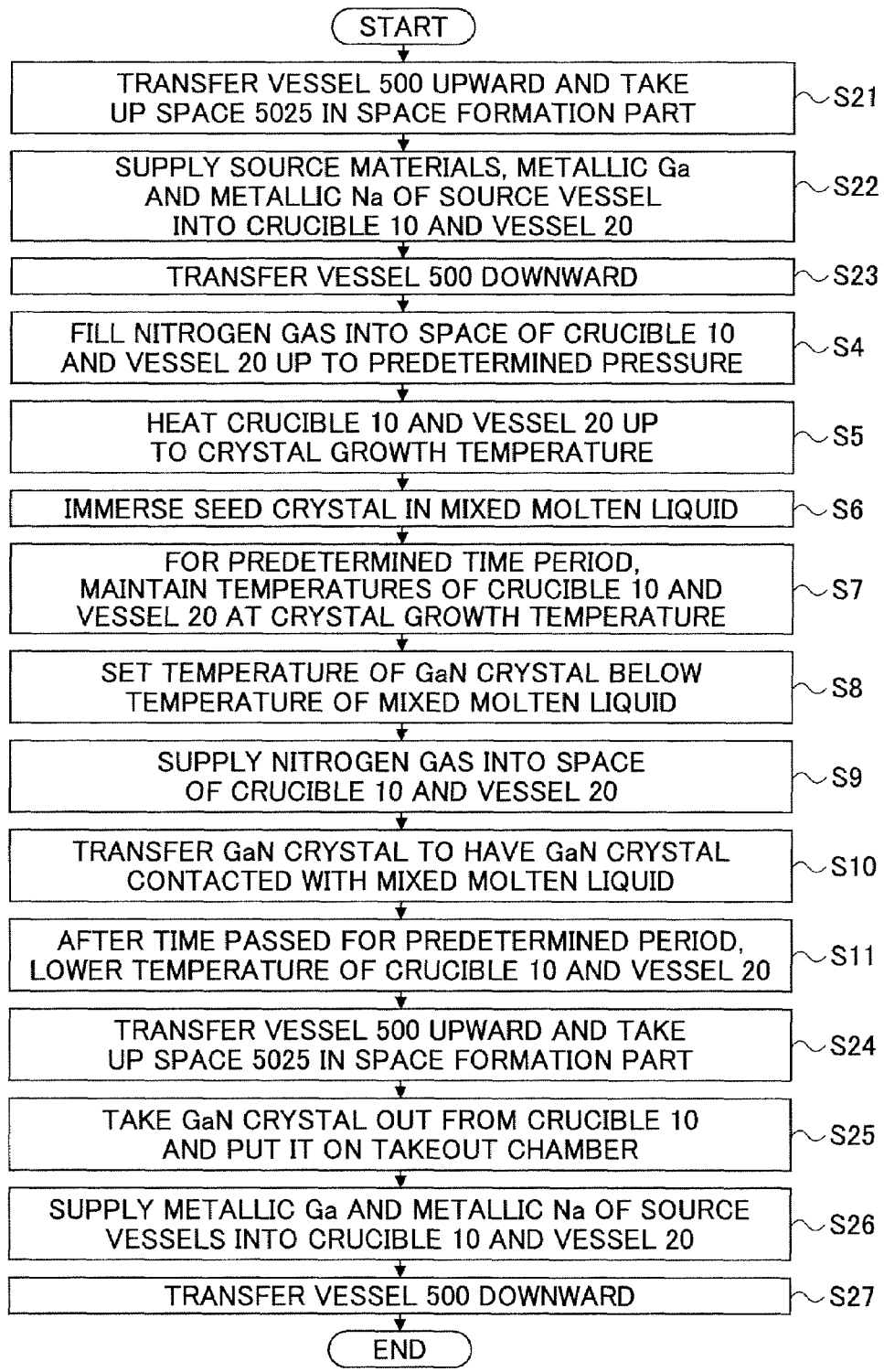
FIG. 14 is a flowchart for explaining the method of GaN crystal growth using the crystal manufacturing apparatus shown in FIG. 12.

A second embodiment according to the present invention is explained by referring to FIG. 12 - FIG. 14. FIG. 12 shows a schematic diagram of a crystal manufacturing apparatus 100A related to the second embodiment of the present invention.

The crystal manufacturing apparatus 100A utilizes a sealed vessel 500 instead of the holding vessel 300 and the sealed vessel 400 of the crystal manufacturing apparatus 100 that is previously described above, and the sealed vessel 500 is modified to be capable of moving upward or downward in gravitational direction DR1 relative to "the crucible 10, the reaction vessel 20, the holding device 40, the heating devices (50, 60), and the temperature sensors (51, 61)." Further, in the following, the present embodiment is mainly described based on the differences from the first embodiment and uses identical symbols for previously explained component parts; therefore descriptions for such symbols are simplified or omitted.

In the following, a part that is comprised of the crucible 10, the reaction vessel 20, the holding device 40, the heating devices (50, 60), and the temperature sensors (51, 61) is named "an inner device."

The sealed vessel 500 includes a vessel placing space 501 and a space formation part 502. The vessel placing space 501 includes a bell shape, and the space formation part 502 includes a cylindrical external shape. Further, the vessel placing space 501 is placed on the space formation part 502. The vessel placing space 501 and the space formation part 502 are made of SUS316L and fabricated in one body. Further, the vessel placing space 501 and the space formation space 502 are pressure resistant vessels.

The vessel placing space 501 is fixed on a supporting part (not shown) that is vertically movable in the gravitational direction DR1. Thereby, the sealed vessel 500 is transferred (moved) in the gravitational direction DR1 as the supporting part moves vertically in the gravitational direction.

Further, the space formation part 502 comprises an upper part 5021, a vertical part 5022, and a base part 5023. There is a stage 600 inside the space formation part 502 which is fixed on a floor with supporting poles 700 that penetrate the base part 5023 of the space formation part 502 and stands on the floor. Thus, the stage 600 is not transferred when the sealed vessel 500 is transferred.

The inner device described above is placed on the stage 600. Then, the inner device is not transferred when the sealed vessel 500 is transferred.

At the lowest level of the sealed vessel 500, the stage 600 contacts the upper part 5021 via an O-ring 503. Then, the stage 600 and the upper part 5021 can be connected with bolts (507, 508). Further, the stage 600 contacts the vertical part 5022 via an O-ring 505. Therefore, the spaces below the stage 600 and above the stage 600 are separated due to sealing by the O-ring 505 when the sealed vessel 500 is transferred.

The gas purification apparatus provides a high purity nitrogen atmosphere via piping 1140 and piping 1150.

There are a transparent window (not shown) and at least a pair of gloves (not shown) in the space formation part 502 for enabling an operator to work in the space formation part 502. Thus, the space formation part 502 provides a function as a glove box.

Gases in the vessel placing space 501 can be evacuated by a vacuum pump 330 through an evacuating tube 320. In the pathway of the evacuating tube 320 is included an open/close valve 340.

A gas cylinder 410 is filled with nitrogen gas. The nitrogen gas from the gas cylinder 410 is supplied into the vessel placing space 501 via a gas supplying tube 350 after having its pressure controlled by a pressure control device 370 and supplied into the space formation part 502 via the gas supplying tube 350 and a gas supplying tube 380. In the pathway of the gas supplying tube 350 is provided an open/close valve 360, and an open/close valve 390 is provided in the pathway of the gas supplying tube 380.

Gases in the space formation part 502 can be evacuated with a vacuum pump 530 through an evacuating pipe 540. An open/close valve 550 is provided in the pathway of the evacuating pipe 540.

A source material storage chamber 580 is attached with the vertical part 5022. The inside of the source material storage chamber 580 is maintained with a nitrogen gas atmosphere, and metallic Ga and metallic Na are stored in it. The source material storage chamber 580 includes a source supplying entrance (not shown) between the space formation part 502 and itself.

Further, the vertical part 5022 is attached to a crystal storage chamber 590. The inside of the crystal storage chamber 590 is maintained with a nitrogen atmosphere, and a GaN crystal taken from the crucible 10 is stored in it. The crystal storage chamber 590 includes a take-out gate (not shown) between the space formation part 502 and itself.

The source material storage chamber 580 and the crystal storage chamber 590 allow evacuating gas and exchanging gas such as high purity nitrogen gas or argon gas by using an evacuation pump (not shown).

The gas supplying tube 90 is connected with a pipe connecting part 23 through a base part 5023 of the sealed vessel 500 and the stage 600 by penetrating.

Method of Manufacturing GaN Crystal

A method of manufacturing a GaN crystal utilizing the crystal manufacturing apparatus 100A constructed as described above is explained by referring to FIG. 14. A flowchart of FIG. 14 shows procedures or operation to be performed by an operator. The flowchart of FIG. 14 is modified by replacing the steps S1-S3 and the steps S12-S14 with the steps S21-S23 with the steps S24-S27.

(2-1) Transfer the sealed vessel 500 upward by a holding part (not shown). Thereby, the space 5025 is formed in the space formation part 502 (step S21).

As the volume of space 5024 in the space formation part 502 decreases with transferring of the sealed vessel 500, the evacuation pump 530 evacuates nitrogen gas gradually to maintain the pressure in the space 5024 to be 0.1 MPa+α.

Further, as the volume in the space of the vessel placing space 501 increases with transferring of the sealed vessel 500, the pressure control device 370 supplies nitrogen gas into the vessel placing space 501 to maintain the pressure in the vessel placing space 501 to be 0.1 MPa+α. Thus, the sealed vessel 500 is transferred while maintaining the pressure balance of the vessel placing space 501 and the space formation part 502.

When the stage 600 contacts the base part 5023 of the sealed vessel 500 (see FIG. 13), the sealed vessel 500 stops being transferred. Then, the "inner device" is located in a position lower than a position of the upper part 5021 of the space formation part. This position of the reaction vessel 20 is defined as "a second position."

(2-2) Using the gloves provided in the sealed vessel 500, remove the lid 22 of the reaction vessel 20 from the body part 21 in the space 5025 with nitrogen a gas atmosphere.

(2-3) Take the metallic Ga and the metallic Na out of the source material storage chamber 580 through the source supplying entrance. Further, attach the seed crystal 5 on the one end of the holding device 40.

(2-4) Close the reaction vessel 20 by assembling the lid 22 onto the body part 21.

(2-5) Transfer the sealed vessel 500 downward using the supporting part (not shown) (step S23).

The volume of the space above the stage 600 decreases with transferring of the sealed vessel 500, so that the evacuation pump 330 evacuates nitrogen gas gradually to maintain the pressure in the space above the stage 600 to be 0.1 MPa+α through the valve 340. Further, the volume of the space 5024 below the stage 600 increases with transferring of the sealed vessel 500, so that the pressure control device 370 supplies nitrogen gas gradually into the space 5024 to maintain the pressure in the space 5024 to be 0.1 MPa+α.

When the stage 600 contacts with the upper part 5021, the sealed vessel 500 stops transferring. At this point, the "inner device" is located in the vessel placing part 501 that is above the space formation part 502. This position of the reaction vessel is defined as "a first position."

(2-6) Perform operation in the same way of the steps S4-S11 above.

(2-7) When the temperature of the crucible 10 and the reaction vessel 20 reaches room temperature, perform operations in the same as the steps (2-1) and (2-2) above (step S24).

(2-8) Take the GaN crystal manufactured out of the crucible 10, put it in the crystal storage chamber 590 (step S25).

(2-9) Perform the same operations of steps (2-3)-(2-5), and prepare the succeeding operations of GaN crystal manufacture (step S26, step S27).

(2-10) Perform the same operations of steps of (2-6)-(2-8), and manufacture a GaN crystal.

In the following, repeat the same operations of steps of (2-9) and (2-10) above when necessary.

As described above, in the second embodiment related to the crystal manufacturing apparatus 100A of the present invention, "gas supplying device" comprises the gas supplying tube 90, the pressure control device 120, and the gas cylinder 130.

Further, "a method of the operation" comprises at least using a pair of gloves.

Further, "a transfer mechanism" comprises the supporting part (not shown).

Further, "a pressure control device" comprises the evacuation pumps (330, 530), the evacuating tubes (320, 540), and the open/close valves (340, 360, 390, 550), the gas cylinder 410, the pressure control device 370, and the gas supplying tubes (350, 380).

As explained above, according to the second embodiment related to the crystal manufacturing apparatus 100A, the operation comprises transferring the sealed vessel 500 upward, forming the space 5025 with nitrogen a gas atmosphere in the space formation part 502, utilizing gloves in the space 5025, supplying sources (metallic Ga and metallic Na) into the crucible 10, and taking out the manufactured GaN crystal from the crucible 10. Thereby, it enables manufacturing a GaN crystal while preventing exposure of "the inner device" to air. Thus, a similar effect of the first embodiment above can be obtained.

Further, for the second embodiment above, for example, a pressure adjusting valve may be provided on the stage 600 instead of the above "pressure control device" to enable transferring nitrogen gas between the space formed above the stage 600 and the space formed below the stage 600 so that the pressures in the two spaces are equally balanced while the sealed vessel 500 is being transferred vertically.

Figure 15:
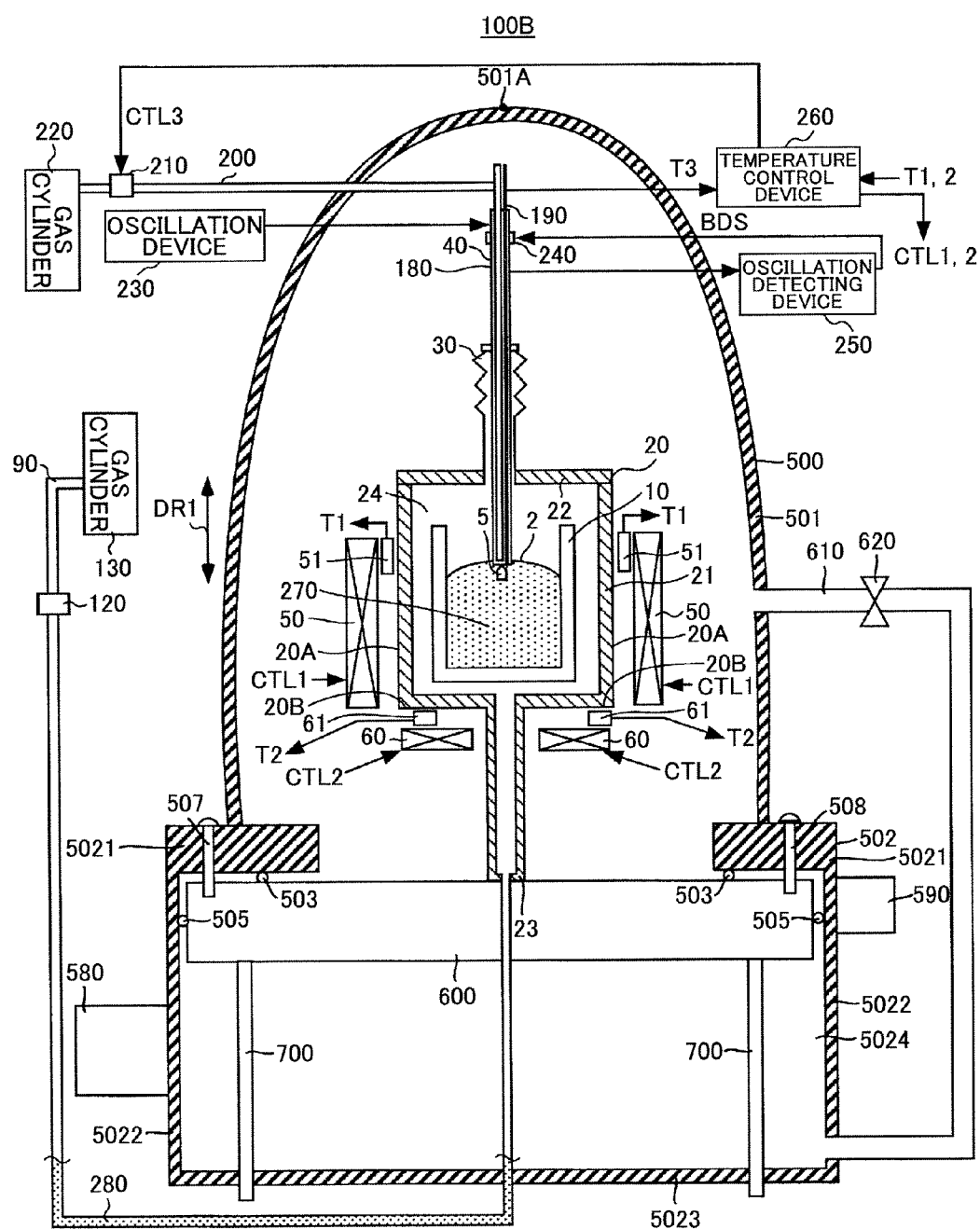
FIG. 15 is a schematic diagram for explaining a modified example of the crystal manufacturing apparatus of FIG. 12.

Further, for example, in a crystal manufacturing apparatus 100B shown in FIG. 15, instead of the above "pressure control device", the pressure may be adjusted by utilizing the piping 610 and the pressure adjusting valve 620 for equally balancing the pressures of the space formed above the stage 600 and the space formed below the stage 600 while the sealed vessel 500 is being transferred vertically.

For the piping 610, one end is connected to the vessel placing part 501 and the other end is connected to the space formation part 502. The pressure adjusting valve 620 is provided in the pathway of the piping 610 and equally balances the pressures in the vessel placing space 501 and the space formation part 502.

Further, the crystal manufacturing apparatus 100A and the crystal manufacturing apparatus 100B may provide gas purification apparatuses for supplying inert gas or nitrogen gas containing amounts of moisture and oxygen below 1 ppm into the space formation part 502.

Third Embodiment

Figure 16:
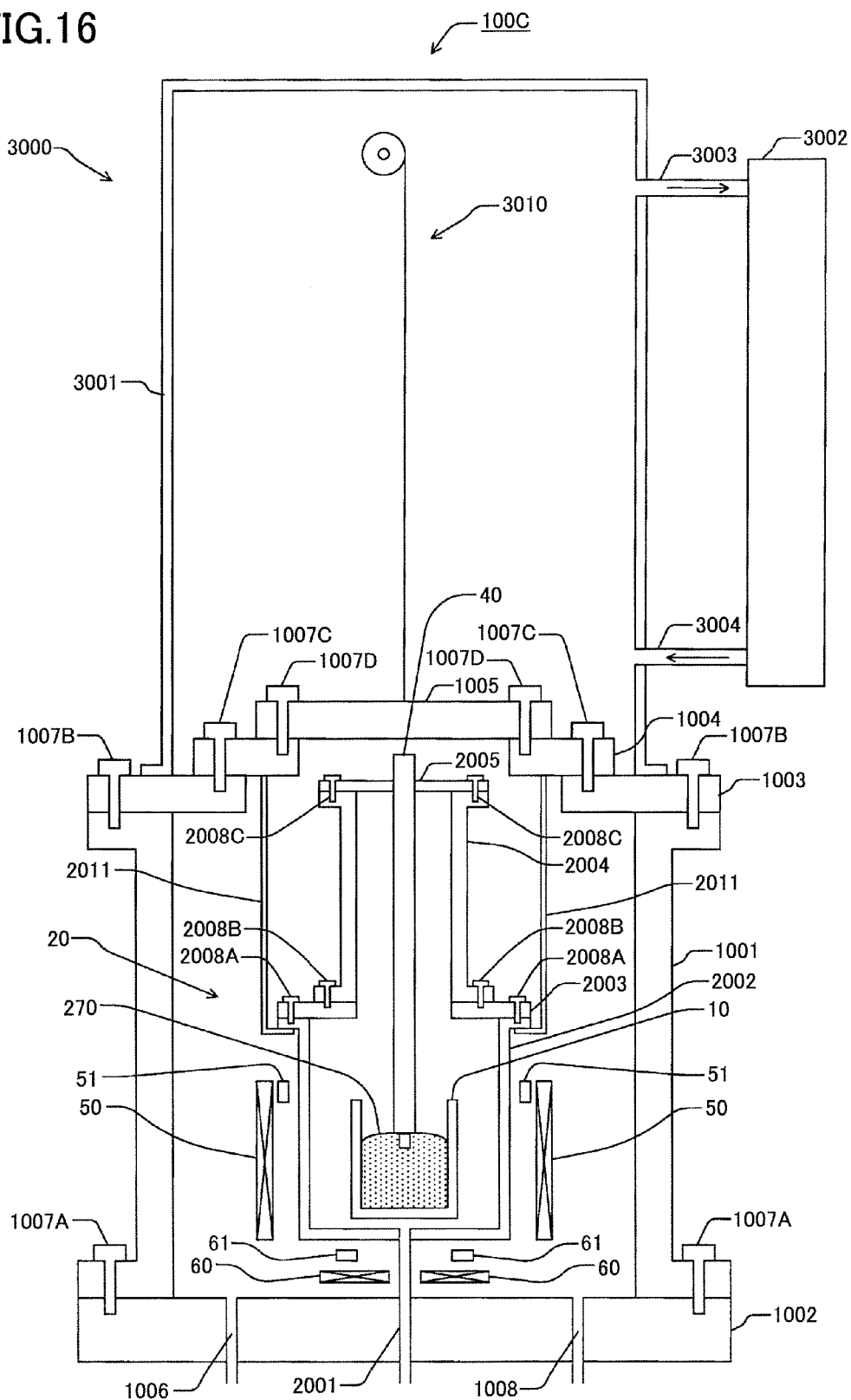
FIG. 16 is a schematic cross-sectional diagram of a crystal manufacturing apparatus related to a third embodiment.
Figure 17C:
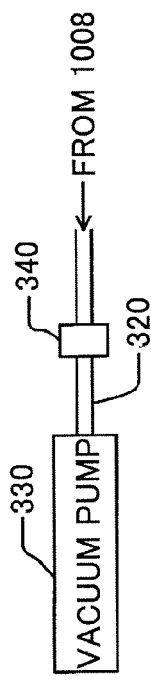
Figure 17D:
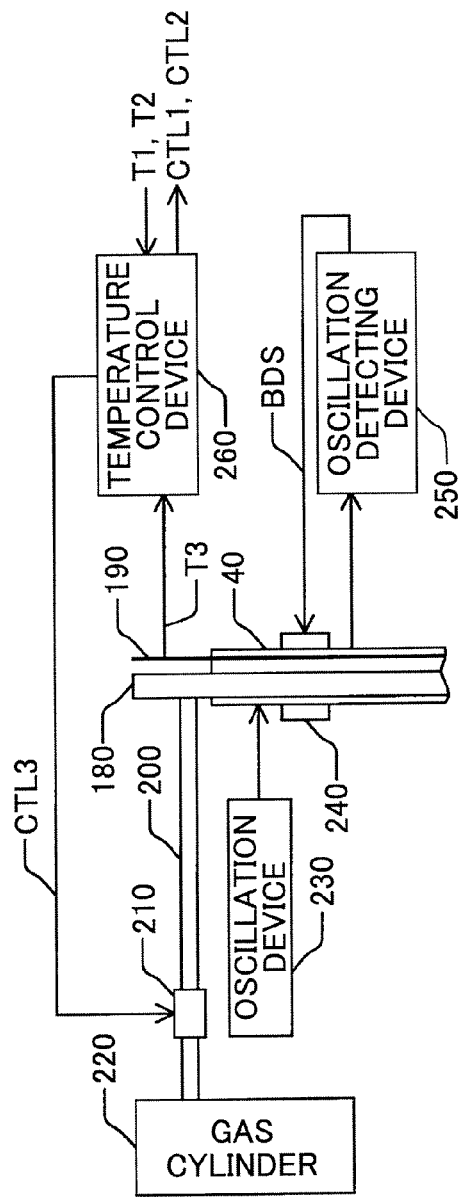

A third embodiment of the present invention is explained by referring to FIG. 16-FIG. 20. FIG. 16 shows a schematic diagram of a crystal manufacturing apparatus 100C related to the third embodiment of the present invention.

The crystal manufacturing apparatus 100C provides a crucible 10, a reaction chamber 20, a holding device 40, heating devices (50, 60), temperature sensors (51, 61), a sealed vessel 3000, and a gas supplying device (not shown) that is similar to the "gas supplying device" described above.

A "inner device" comprising the crucible 10, the reaction vessel 20, the holding device 40, the heating devices (50, 60), and the temperature sensors (51, 61) is integrated as a unit.

Further, it is characterized in that the "inner device" is transferred upward in the sealed vessel 3000 when source materials are supplied into the crucible 10, and when a manufactured GaN crystal is taken out from the crucible 10. Then, in the following, the present embodiment is mainly explained based on the differences between the present embodiment and the first and the second embodiments, and when identical or similar symbols for previously explained component parts are used, descriptions for such symbols in the first and second embodiments are simplified or omitted (see FIG. 17A-FIG. 17D).

The sealed vessel 3000 includes an upper vessel part 3001 and a lower vessel part 1001.

The upper vessel part 3001 includes a flange part 1003 and is connected with the lower vessel part 1001 using a number of bolts 1007B. The inner diameter of the flange part 1003 has a size that allows passing the "inner device."

Figure 18:
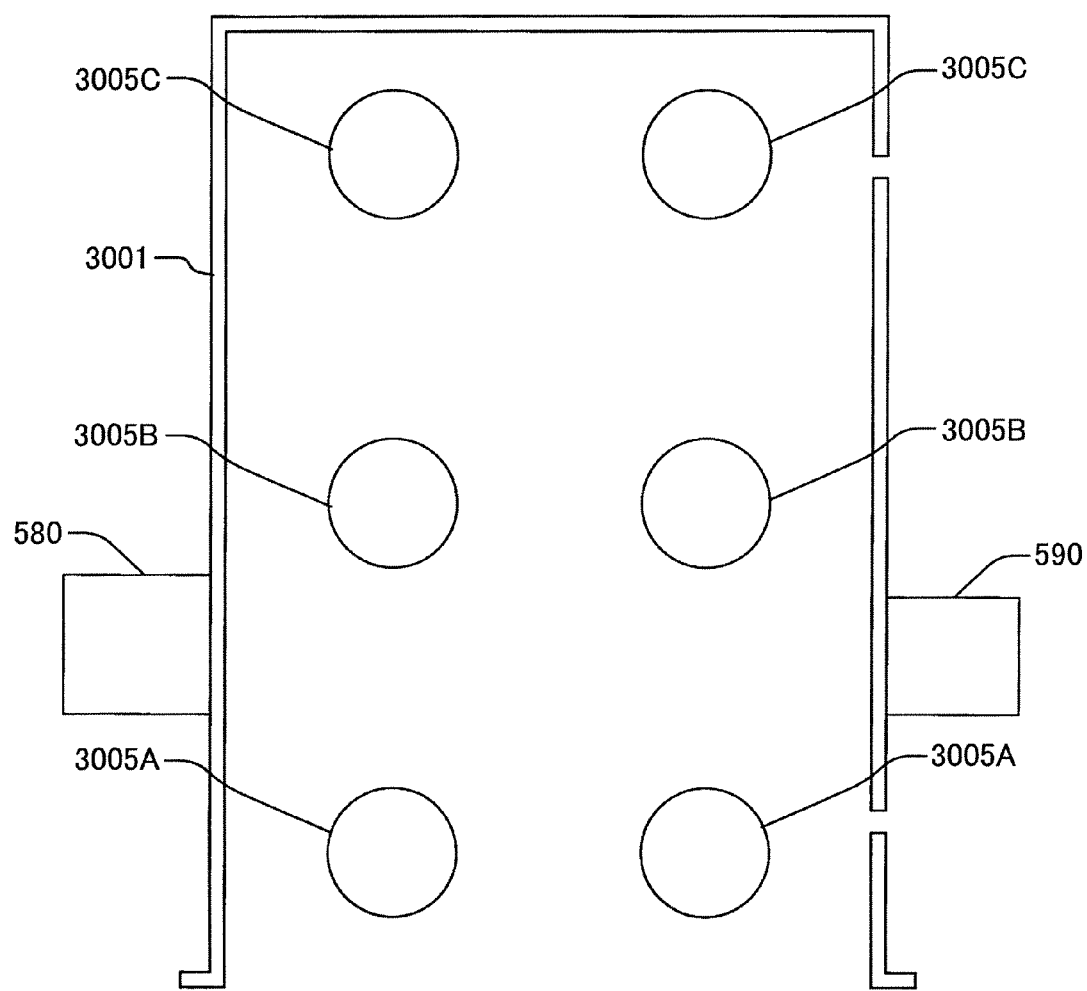
FIG. 18 is a schematic diagram for explaining gloves provided in the sealed vessel of FIG. 16.
Figure 19:
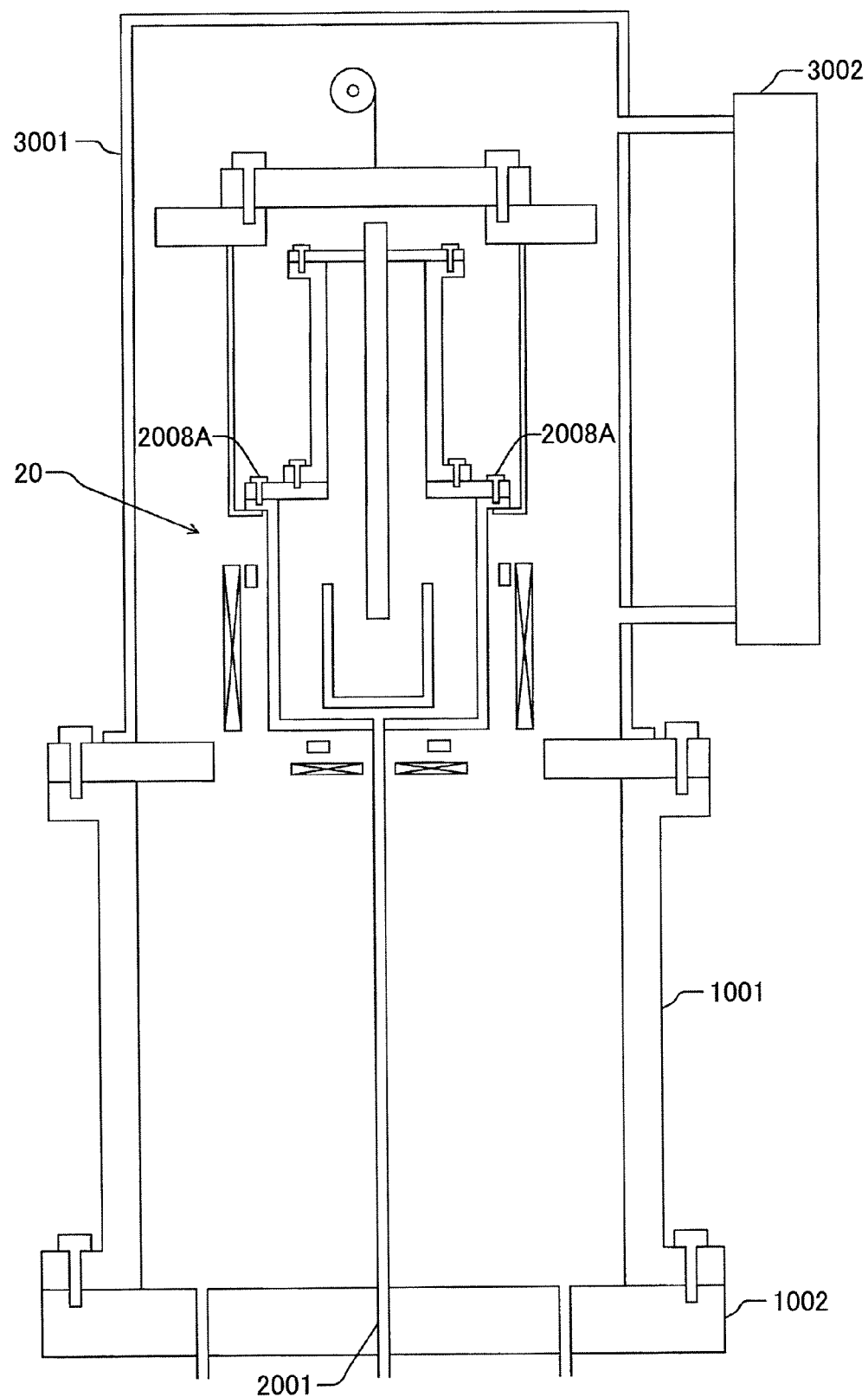
FIG. 19 is a schematic diagram (step 1) for explaining the operational procedure when source materials are supplied into the crystal manufacturing apparatus of FIG. 16.

The upper vessel part 3001, as an example shown in FIG. 18, is provided with three pairs of gloves (3005A, 3005B, 3005C). It should be noted that the number of gloves and their locations are not limited by the present embodiment.

Further, the upper vessel part 3001 includes a source material storage chamber 580 storing metallic Na and metallic Ga, and a crystal storage chamber 590 for storing manufactured GaN crystals. Further, the source material storage chamber 580 includes a mechanism that allows supplying source materials into the source material storage chamber 580 from the outside of the sealed vessel 3000 without affecting the atmosphere in the sealed vessel 3000. The crystal storage chamber 590 includes a mechanism that allows taking a GaN crystal stored in the crystal storage chamber 590 out of the sealed vessel 3000 without affecting the atmosphere in the sealed vessel 3000.

Further, the upper vessel part 3001 can be supplied with additional nitrogen gas when necessary for maintaining its internal pressure to be slightly higher than the atmospheric pressure.

The gas purification apparatus 3002 is connected to the upper vessel part 3001 through two pipes (3003, 3004). Thereby, impurities that are contained in the space of the upper vessel part 3001 are removed.

The lower vessel part 1001 can separate a base part 1002 by removing a number of bolts 1007A. The base part 1002 is penetrated by gas supplying tubes (1006, 2001), an evacuating tube 1008, power cables (not shown) for heaters, and lead wires (not shown) of thermocouples for temperature monitoring, while maintaining their seals. Further, the gas supplying tube 2001 has flexibility of expansion and contraction to follow the transferring of the "inner device."

The inner space of the lower vessel part 1001 can be separated from the inner space of the upper vessel part 3001 by using a flange 1004 and a lid 1005. The flange 1004, having a smaller internal diameter than the flange part 1003, is connected to the flange part 1003 with a number of bolts 1007C.

The lid 1005 is fixed to the loading device 3010 in the sealed vessel 3000. For the loading device 3010, one end is connected to the lid 1005 and another end includes a wire connected to a reel, with a motor turning the reel. Thus, the "inner device" can be transferred up and down by using the loading device 3010.

The sealed space, formed by the lower vessel part 1001, the flange part 1003, the flange 1004, and the lid 1005, is made for a pressure resistance to over 100 atmospheres.

Thus, a pressure-resistant vessel can be comprised of the lower vessel part 1001, the flange part 1003, the flange 1004, and the lid 1005. Further the lower vessel part 1001, the flange 1003, the flange 1004, and the lid 1005 are water cooled. Pressure resistance is not necessary for the upper vessel part 3001.

The connection of the sealed vessel 3000 using the bolts is performed through a resin O-ring.

The reaction vessel 20 includes a body part 2002 accommodating the crucible 10, a tube extension part 2004, and a lid part 2005.

The lower part of the tube extension part 2004 is connected to the body part 2002 through the flange 2003 with plural bolts 2008A and 2008B. The upper part of tube extension part 2004 is connected to the lid part 2005 with plural bolts 2008C. The tube extension part 2004 includes a bellows function and is flexible.

A gas supplying tube 2001 is connected to the bottom of the body part 2002, which allows introducing gas into the reaction vessel 20.

The reaction vessel 20 is held with a hanging part 2011. The hanging part 2011 is fixed on the flange 1004. Thereby, this provides for long-time reliability of the device because there is no mechanical interference with other parts due to thermal expansion or thermal shrinkage due to rising temperature or falling temperature of the device.

Further, the bolt connection of the reaction vessel 20 is made with a metallic O-ring.

The pressures of the inner part and the outside of the reaction vessel are controlled to be almost balanced through the gas supplying tubes (1006, 2001). Thereby, the reaction vessel 20 need not be pressure resistant and can be constructed with a thin wall metallic vessel.

Manufacturing Method of GaN Crystal (3-1) By using gloves provided in the sealed vessel 3000, remove all the bolts 1007C in the sealed vessel 3000.

(3-2) With the loading device 3010, transfer the lid 1005 upward. Thereby, the "inner device" is transferred upward inside the sealed vessel 3000 (see FIG. 19). The loading device 3010 stops when the lid 1005 reaches the predetermined position. This position is named "a second position."

Figure 20:
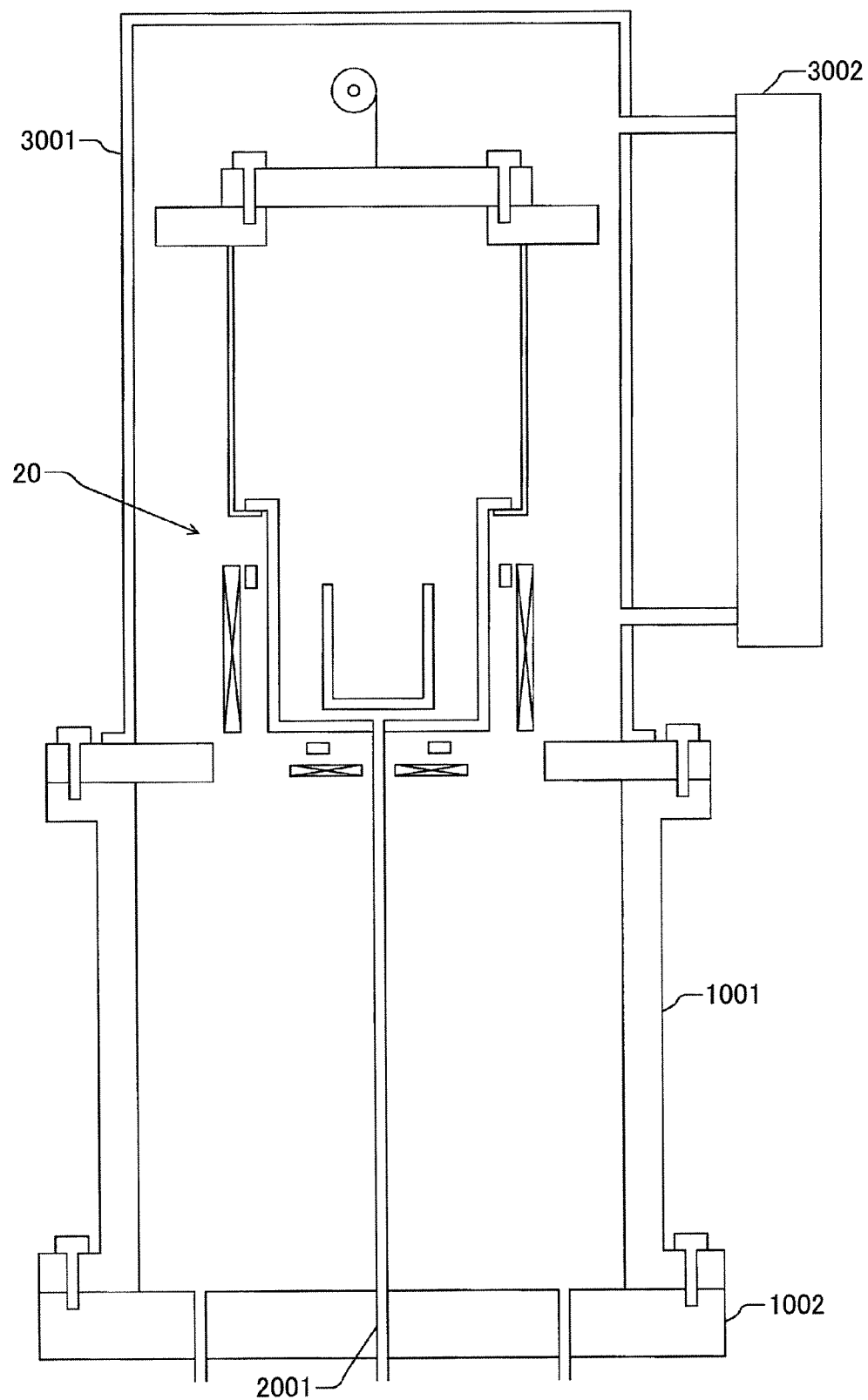
FIG. 20 is a schematic diagram (step 2) for explaining the operational procedure when source materials are supplied into the crystal manufacturing apparatus of FIG. 16.

(3-3) Remove all the bolts 2008A in the sealed vessel 3000, and remove the tube extension part 2004 and the holding device 40 with the lid part 2005 (see FIG. 20).

(3-4) Take out the metallic Na and metallic Ga from the source storage chamber, and supply them into the crucible 10 with a mixing ratio 1:1. Further, fix the seed crystal 5 onto the one end of the holding device 40.

(3-5) Attach the tube extension part 2004 to the holding device 40 with the lid part 2005, and connect them with the bolts 2008.

(3-6) Transfer the lid 1005 downward with the loading device 3010. Thereby, the "inner device" is transferred downward. The loading device 3010 stops when the lid 1005 reaches a predetermined position. Then, this position is named "a first position."

(3-7) Connect the flange 1004 and the flange part 1003 with the bolts 1007C.

(3-8) Perform the same operations as the above steps of S4-S11 sequentially.

(3-9) Perform the above operations (3-1)-(3-3) when the temperatures of the crucible 10 and the reaction vessel 20 become room temperature (3-10) Take the manufactured GaN crystal out from the crucible 10, and store it in the crystal storage chamber (not shown).

(3-11) Perform the same operations (3-4)-(3-7) above, make preparations for the succeeding GaN crystal manufacturing.

(3-12) Perform the same operations (3-8)-(3-10) above, and manufacture a GaN crystal.

In the following, repeat the same operations (3-11) and (3-12) when necessary.

As explained above, for the crystal manufacturing apparatus 100C related to the present embodiment 3, the "gas supplying device" is comprised of the gas supplying tube 90 and the pressure control device 120.

Further, the "operational method" is comprised of using three pair of gloves (3005A, 3005B, and 3005C).

Further, the "transferring mechanism" is provided with the loading device 3010.

As explained above, according to the crystal manufacturing apparatus 100C related to the present embodiment 3, the "inner device" is transferred upward by using the loading device 3010 in the sealed vessel 3000 with a nitrogen gas atmosphere, and using the gloves provides supplying source materials (metallic Ga and metallic Na) into the crucible 10 and taking out the manufactured GaN crystal from the crucible 10. Thereby, manufacturing GaN can be performed while protecting the "inner device" from being exposed to air. Thus, a similar effect of the above first embodiment can be obtained by the present embodiment.

Fourth Embodiment

Figure 21:
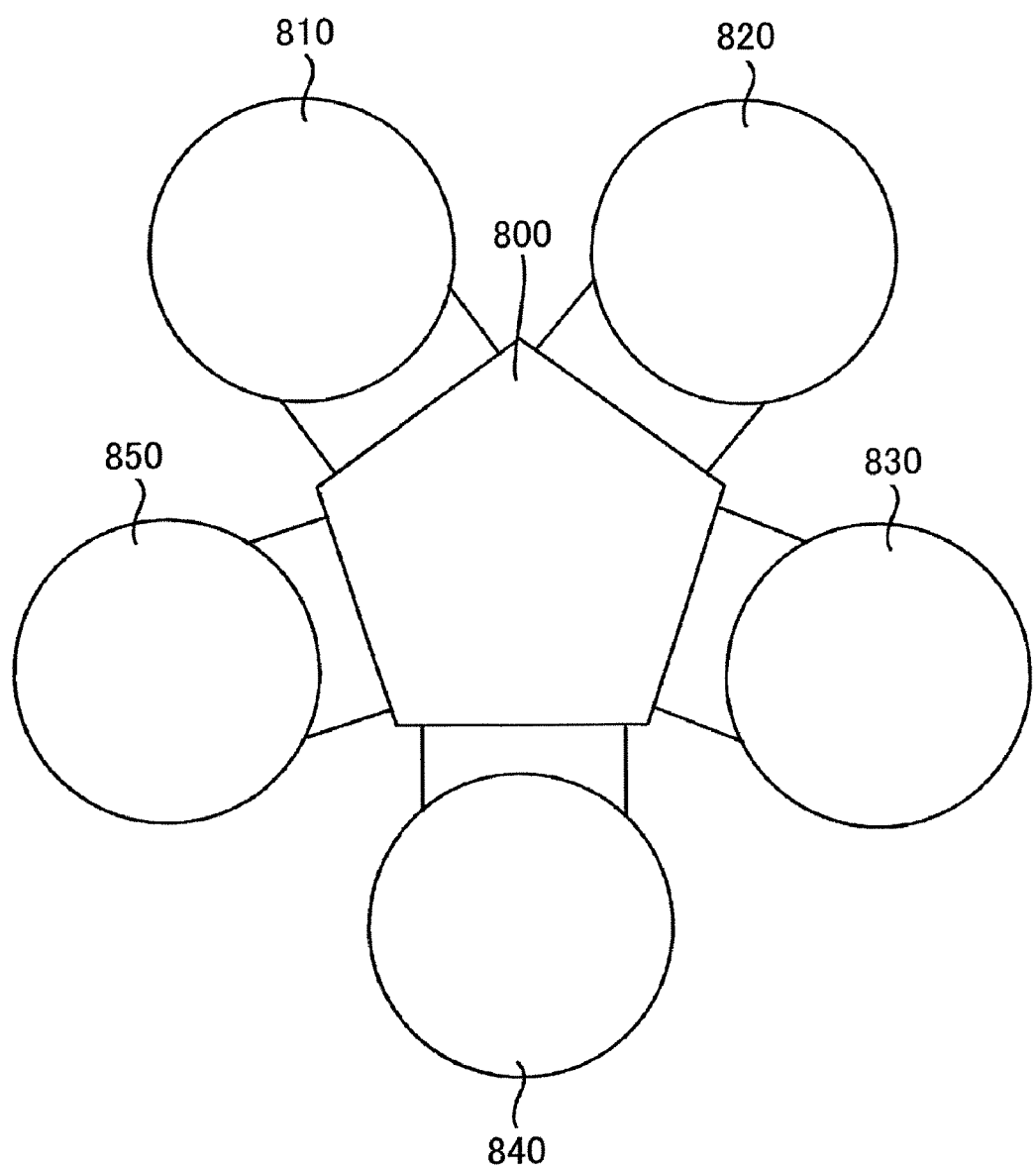
FIG. 21 is a schematic diagram for explaining a crystal manufacturing system related to a fourth embodiment.

A fourth embodiment of the present invention is explained by referring to FIG. 21. FIG. 21 shows a schematic diagram of a crystal manufacturing system related to the fourth embodiment of the present invention.

The present crystal manufacturing system comprises a source material vessel 800 and plural crystal manufacturing apparatuses (810, 820, 830, 840, and 850). The source material vessel 800 has a plane pentagon shape and accommodates metallic Ga and metallic Na in it.

Each crystal manufacturing apparatus is equivalent to any of the above crystal manufacturing apparatuses 100, 100A, 100B, or 100C. Further, for each crystal manufacturing apparatus, by using gloves provided in the apparatus, metallic Ga and metallic Na can be taken from the source material vessel 800 and be supplied them the individual crucible, almost without changing the atmosphere in the sealed vessel.

According to the crystal manufacturing system related to the fourth embodiment, as GaN crystals are manufactured by plural crystal manufacturing apparatuses independently, so that the mass productivity of crystal manufacturing can be increased.

Although the present fourth embodiment has explained an example of the crystal manufacturing system having five crystal manufacturing apparatuses, the present invention is not limited to this embodiment, but various variations and modifications may be made without departing from the scope of the present invention. More generally, the system is comprised of a source material vessel with an n-sided polygon (n is an integer, $n \geq 3$) with n crystal manufacturing apparatuses connected to the source material vessel. In the present case, the source material vessel may have a regular n-sided polygon shape or a non-regular n-sided polygon shape.

In individual embodiments above, although it has explained for the crystal growth temperature at 800° C., it is not limited to the embodiments, as the crystal growth temperature may be a temperature belonging to the region REG3 in FIG. 9. Further, the nitrogen gas pressure in the reaction vessel 20 may be a pressure belonging to the same region (region REG3) of the crystal growth temperature.

In the embodiments above, it has explained that a GaN crystal is manufactured based on the seed crystal growth. It is not limited to the embodiments, but GaN crystals may be manufactured by using multiple nucleation growth caused by multiple nucleation generation of GaN crystals instead of the seed crystal growth. In such case, the crystal growth temperature may be a temperature that belongs to the region REG2 shown in FIG. 9. Further, the nitrogen gas pressure in the reaction vessel 20 may belong to a pressure at the same region (region REG2) as a pressure of crystal growth temperature.

In each embodiment above, the oscillation device 230, the up/down mechanism 240, and the oscillation detecting device 250 may be omitted. Even in this case, GaN crystals can be manufactured without exposing the "inner device" to air.

Further, for each embodiment, the piping 180, the thermocouple 190, the gas supplying tube 200, the flow meter 210, and the gas cylinder 220 can be omitted. Even this case, GaN crystals can be manufactured without exposing the "inner device" to air.

Further, for each embodiment, the piping 180, the thermocouple 190, the gas supplying tube 200, the flow meter 210, the gas cylinder 220, the oscillation device 230, the up/down mechanism 240, and the oscillation detecting device 250 may be omitted. Even this case, GaN crystals can be manufactured without exposing the "inner device" to air.

For each embodiment above, although it has explained that supplying metallic Na and metallic Ga into the crucible 10 is performed in a nitrogen gas atmosphere, the present invention is not limited to that embodiment. Metallic Na and metallic Ga may be supplied into the crucible 10 in an atmosphere of an inert gas, such as Ar, He, Ne or Kr. In that case, it is preferable that the amount of moisture contained in the inert gas or nitrogen gas be below 1 ppm, and the amount of oxygen contained in the inert gas or nitrogen gas be below 1 ppm.

Further, for individual embodiments above, although it has been explained that the mixed molten liquid 270 comprises metallic Na and metallic Ga, the present invention is not limited to the embodiment. Instead of Na, an alkali metal, such as lithium (Li), or potassium (K) or an alkaline earth metal, such as magnesium (Mg), calcium (Ca), or strontium (Sr) may be used. Further, instead of Ga, a group III metal, such as boron (B), aluminum (Al), or indium (In) may be used. Thus a mixed molten liquid made of a Group III metal (including boron) and alkali metal or alkaline earth metal may be used.

For individual embodiments above, instead of nitrogen gas, a compound containing nitrogen as a constituent element in it, such as sodium azide and ammonia may be used.

The group III nitride crystal, manufactured by using a crystal manufacturing apparatus related to the individual embodiments above, is used for fabricating Group III nitride semiconductor devices, such as light emitting diodes, semiconductor lasers, photodiodes, and transistors.

Further, the present invention is not limited to these embodiments, but various variations and modifications may be made without departing from the scope of the present invention.

As explained above, according to the embodiments of the crystal manufacturing apparatus of the present invention, it is preferable to perform Group III nitride crystal manufacturing without exposing parts inside of the outer vessel to air and to avoid removing an inner vessel and the like.

The present application is based on Japanese Priority Application No. 2007-056859 filed on Mar. 7, 2007, and Japanese Priority Application No. 2007-320289 filed on Dec. 12, 2007 with the Japanese Patent Office, the entire contents of which are hereby incorporated herein by reference.

What is claimed is:

1. A crystal manufacturing apparatus for manufacturing a group III nitride crystal, comprising:
   a crucible that holds a mixed molten liquid including an alkali metal and a group III metal;
   a reaction vessel accommodating the crucible in the reaction vessel;
   a heating device that heats the crucible with the reaction vessel;
   a holding vessel having a lid that is capable of opening and closing, accommodating the reaction vessel and the heating device in the holding vessel;
   a sealed vessel accommodating the holding vessel in the sealed vessel, having an operating device that enables opening the lid of the holding vessel for supplying source materials into the crucible and taking out a manufactured group III nitride crystal under a sealed condition, and closing the lid of the holding vessel that is sealed in the sealed vessel, the sealed vessel including an inert gas atmosphere or a nitrogen atmosphere in the sealed vessel; and a gas supplying device for supplying a nitrogen gas to the mixed molten liquid through each of the vessels.

2. A crystal manufacturing apparatus for manufacturing a group III nitride crystal, comprising:

a crucible that holds a mixed molten liquid that includes an alkali metal and a group III metal;

a reaction vessel accommodating the crucible in the reaction vessel;

a heating device that is positioned at a predetermined location relative to the crucible, and heats the crucible through the reaction vessel;

a sealed vessel accommodating the reaction vessel in the sealed vessel, having an operating device that enables opening a lid of the reaction vessel for supplying source materials into the crucible and taking out a manufactured group III nitride crystal under a sealed condition, and closing the lid of the reaction vessel that is sealed in the sealed vessel, the sealed vessel including an inert gas atmosphere or a nitrogen atmosphere in the sealed vessel;

a gas supplying device for supplying a nitrogen gas to the mixed molten liquid through each of the vessels; and a transfer mechanism that allows for the sealed vessel to be transferred relative to the reaction vessel and the heating device, or the reaction vessel and the heating device to be transferred relative to the sealed vessel, wherein the relative position between the reaction vessel and the heating device is maintained, and the transfer mechanism provides for the reaction vessel in the sealed vessel to be positioned at a first position when crystal growth is performed, and the reaction vessel in the sealed vessel to be positioned at a second position which is different from the first position when the source materials are being supplied or the group III crystal is being taken out.

3. The crystal manufacturing apparatus according to claim 2, further comprising:

a stage in the sealed vessel for loading the reaction vessel and the heating device, wherein the transfer mechanism provides for a position of the stage being changed relative to the sealed vessel during the transferring.

4. The crystal manufacturing apparatus according to claim 3, wherein an inner space of the sealed vessel is separated into two inner spaces by the stage.

5. The crystal manufacturing apparatus according to claim 4, further comprising a pressure control device for controlling the pressures in the two inner spaces to be equally balanced while the stage is being transferred.

6. The crystal manufacturing apparatus according to claims 1, wherein the sealed vessel further comprises a source material storage chamber for storing the source materials and a crystal storage chamber for storing a manufactured group III nitride crystal.

7. The crystal manufacturing apparatus according to claim 6, wherein the source material storage chamber further comprises a supplement mechanism that is capable of supplying source materials into the source material storage chamber from the outside of the sealed vessel without changing the atmosphere in the sealed vessel.

8. The crystal manufacturing apparatus according to claim 6, further comprising a take-out mechanism that is capable of taking out a group III crystal stored in the crystal storage chamber to the outside of the sealed vessel without changing the atmosphere in the sealed vessel.

* * * * *